US012772535B2

(12) United States Patent
Moon et al.

(10) Patent No.: US 12,772,535 B2
(45) Date of Patent: Oct. 20, 2026

(54) INTEGRATED CIRCUIT DEVICE

(71) Applicant: SAMSUNG ELECTRONICS CO., LTD., Suwon-si (KR)

(72) Inventors: Daeyoung Moon, Suwon-si (KR); Jamin Koo, Suwon-si (KR); Kyuwan Kim, Suwon-si (KR); Jonghyeok Kim, Suwon-si (KR); Hyokyoung Kim, Suwon-si (KR); Kisoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/371,869

(22) Filed: Sep. 22, 2023

(65) Prior Publication Data

US 2024/0105791 A1 Mar. 28, 2024

(30) Foreign Application Priority Data

Sep. 22, 2022 (KR) ........................ 10-2022-0120168
Nov. 18, 2022 (KR) ........................ 10-2022-0155799

(51) Int. Cl.
*H10D 64/27* (2025.01)
*H10B 12/00* (2023.01)

(52) U.S. Cl.
CPC ......... *H10D 64/513* (2025.01); *H10B 12/315* (2023.02); *H10B 12/482* (2023.02); *H10B 12/488* (2023.02)

(58) Field of Classification Search
CPC .. H10D 64/513; H10B 12/315; H10B 12/482; H10B 12/488; H10B 12/053; H10B 12/34; H10B 12/0335; H10B 12/485
See application file for complete search history.

(56) References Cited

U.S. PATENT DOCUMENTS 6,949,447 B2 9/2005 Ahn et al.
8,569,817 B2 10/2013 Kwon
(Continued)

FOREIGN PATENT DOCUMENTS

KR 10-0144244 B1 8/1998
KR 10-0505419 B1 8/2005
(Continued)

OTHER PUBLICATIONS

Communication dated Feb. 27, 2024 issued by the European Patent Office in European Application No. 23197325.6.
(Continued)

*Primary Examiner* — Yara B Green
*Assistant Examiner* — Benjamin Michael Kupp
(74) *Attorney, Agent, or Firm* — Sughrue Mion, PLLC

(57) ABSTRACT

An integrated circuit device includes a substrate including a plurality of active regions; a plurality of device isolation layers provided in the substrate and defining the plurality of active regions; a plurality of bitlines spaced apart from each other in a first horizontal direction on the substrate and extending in a second horizontal direction crossing the first horizontal direction; a plurality of insulating fences spaced apart from each other in the second horizontal direction and provided between adjacent bitlines of the plurality of bitlines; a plurality of buried contacts connected to the plurality of active regions and provided between adjacent bitlines of the plurality of bitlines and between the plurality of insulating fences; and a plurality of vertical insulating layers vertically positioned between the plurality of insulating fences and the plurality of buried contacts.

20 Claims, 32 Drawing Sheets

(56) References Cited

U.S. PATENT DOCUMENTS

| | | | |
|---|---|---|---|
| 9,214,382 B2 | 12/2015 | Lee et al. | |
| 10,586,798 B2 | 3/2020 | Kim et al. | |
| 11,183,500 B2 | 11/2021 | Song et al. | |
| 11,251,188 B2 | 2/2022 | Kim et al. | |
| 11,430,793 B2 * | 8/2022 | Pandey | H10B 12/488 |
| 2006/0003565 A1 | 1/2006 | Sasaki | |
| 2022/0059543 A1 * | 2/2022 | Mun | H10B 12/0335 |
| 2022/0157822 A1 | 5/2022 | Ahn et al. | |
| 2022/0238526 A1 * | 7/2022 | Wang | H10D 62/116 |
| 2022/0246620 A1 | 8/2022 | Kang et al. | |
| 2022/0262803 A1 | 8/2022 | Jang et al. | |
| 2022/0415793 A1 | 12/2022 | Kim et al. | |

FOREIGN PATENT DOCUMENTS

| | | |
|---|---|---|
| KR | 10-0845001 B1 | 7/2008 |
| KR | 10-0871465 B1 | 12/2008 |
| KR | 10-2012-0098295 A | 9/2012 |
| KR | 10-2020-0107895 A | 9/2020 |
| KR | 10-2021-0014018 A | 2/2021 |

OTHER PUBLICATIONS

Communication issued Aug. 31, 2026 by the Korean Ministry of Intellectual Property in Korean Patent Application No. 10-2022-0155799.

* cited by examiner

CX2

INTEGRATED CIRCUIT DEVICE

CROSS-REFERENCE TO RELATED APPLICATIONS

This application is based on and claims priority under 35 U.S.C. § 119 to Korean Patent Application No. 10-2022-0155799, filed on Nov. 18, 2022, and Korean Patent Application No. 10-2022-0120168, filed on Sep. 22, 2022, in the Korean Intellectual Property Office, the disclosures of which are incorporated by reference herein in their entireties.

BACKGROUND

The present disclosure relates to an integrated circuit device and a method of manufacturing the same, and more particularly, to an integrated circuit device with buried contacts and a method of manufacturing the same.

In accordance with the rapid development of the electronics industry and user needs, electronic devices are becoming more compact and lightweight. Thus, integrated circuit devices having a high degree of integration used in electronic devices are advantageous, and design rules for configurations of integrated circuit devices are being reduced. For instance, the line width of the bitlines included in integrated circuit devices is being reduced, and the difficulty of a process of forming contacts between the bitlines is gradually increasing.

SUMMARY

One or more example embodiments provide an integrated circuit device which may effectively reduce the difficulty of a process of forming contacts between bitlines.

Embodiments are not limited to the aspects mentioned above, and additional aspects of one or more embodiments not mentioned above will be apparent to those skilled in the art from the following description of example embodiments.

According to an aspect of the disclosure, an integrated circuit device includes: a substrate including a plurality of active regions; a plurality of device isolation layers provided in the substrate and defining the plurality of active regions; a plurality of bitlines spaced apart from each other in a first horizontal direction on the substrate and extending in a second horizontal direction crossing the first horizontal direction; a plurality of insulating fences spaced apart from each other in the second horizontal direction and provided between adjacent bitlines of the plurality of bitlines; a plurality of buried contacts connected to the plurality of active regions and provided between adjacent bitlines of the plurality of bitlines and between the plurality of insulating fences; and a plurality of vertical insulating layers vertically positioned between the plurality of insulating fences and the plurality of buried contacts.

According to an aspect of the disclosure, an integrated circuit device including: a substrate including a plurality of active regions; a plurality of device isolation layers provided in the substrate and defining the plurality of active regions; a plurality of bitlines spaced apart from each other in a first horizontal direction on the substrate and extending in a second horizontal direction crossing the first horizontal direction, wherein spacers are provided on both sidewalls of each of the plurality of bitlines; a plurality of insulating fences spaced apart from each other in the second horizontal direction and provided between adjacent bitlines of the plurality of bitlines, wherein the plurality of insulating fences contact the spacers; a plurality of buried contacts connected to the plurality of active regions and provided between adjacent bitlines of the plurality of bitlines and between the plurality of insulating fences; a plurality of vertical insulating layers vertically positioned between the plurality of insulating fences and the plurality of buried contacts; and a plurality of residual insulating layers provided on sidewalls of at least one of the plurality of insulating fences below the spacers, wherein the plurality of vertical insulating layers and the plurality of residual insulating layers include substantially a same material.

According to an aspect of the disclosure, an integrated circuit device including: a substrate including a plurality of active regions; a plurality of device isolation layers provided in the substrate and defining the plurality of active regions; a plurality of bitlines spaced apart from each other in a first horizontal direction on the substrate and extending in a second horizontal direction crossing the first horizontal direction, wherein spacers are provided on both sidewalls of each of the plurality of bitlines; a plurality of wordlines extending in the first horizontal direction; a plurality of wordline capping layers covering upper surfaces of the plurality of wordlines; a plurality of insulating fences spaced apart from each other in the second horizontal direction and provided between adjacent bitlines of the plurality of bitlines, wherein the plurality of insulating fences contact the spacers; a plurality of buried contacts connected to the plurality of active regions and provided between adjacent bitlines of the plurality of bitlines and between the plurality of insulating fences; a plurality of vertical insulating layers vertically positioned between the plurality of insulating fences and the plurality of buried contacts; a plurality of residual insulating layers provided on sidewalls of at least one of the plurality of insulating fences below the spacers; a plurality of landing pads provided on the plurality of buried contacts; and a plurality of capacitor structures electrically connected to the plurality of landing pads.

BRIEF DESCRIPTION OF THE DRAWINGS

The above and other aspects and features will be more apparent from the following detailed description of example embodiments taken in conjunction with the accompanying drawings, in which.

DETAILED DESCRIPTION

Figure 1:
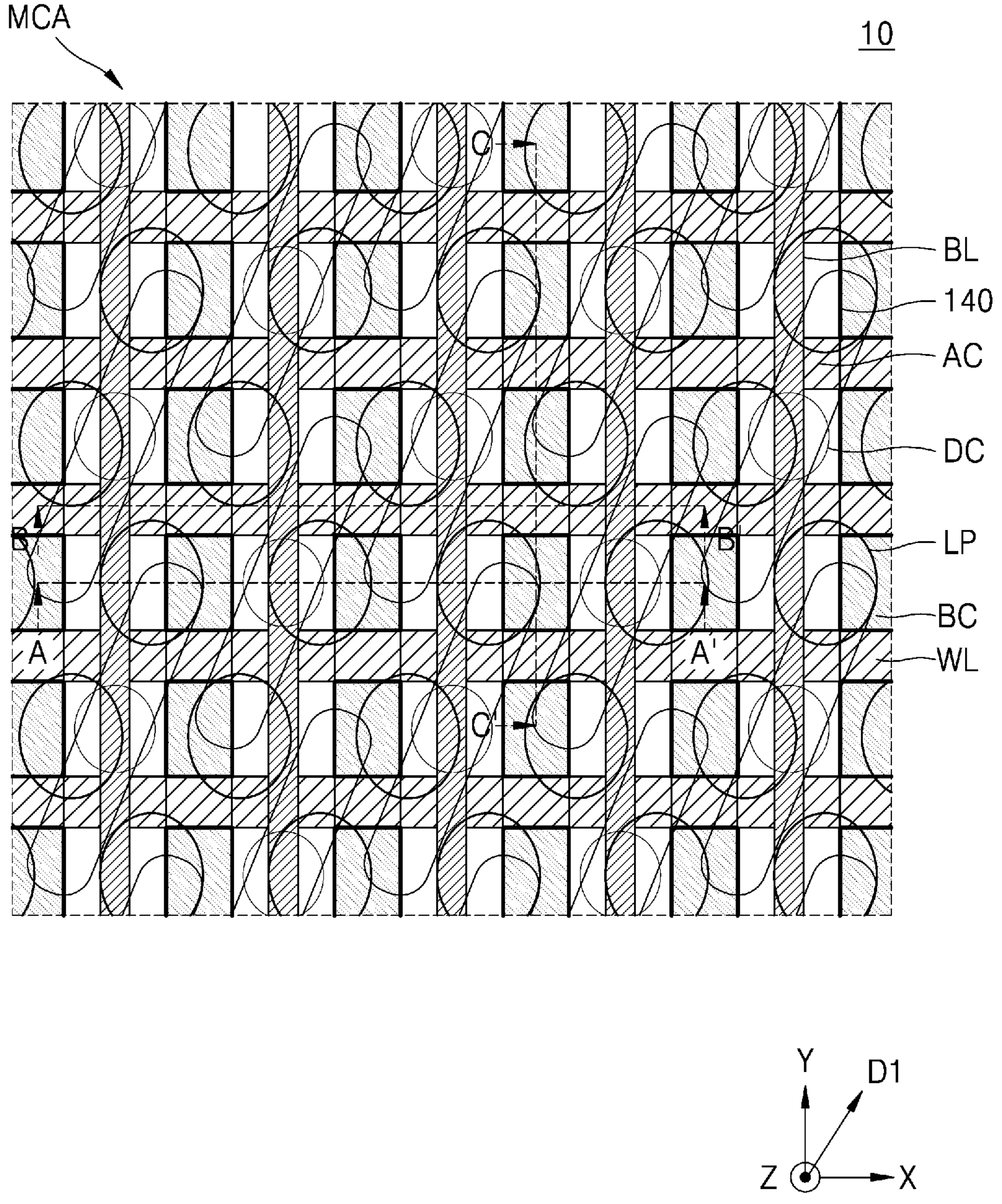
FIG. 1 is a layout diagram of an integrated circuit device according to one or more example embodiments.

Hereinafter, example embodiments will be described in detail with reference to the accompanying drawings. The same reference numerals are used for the same components in the drawings, and duplicate descriptions thereof are omitted.

Figure 2:
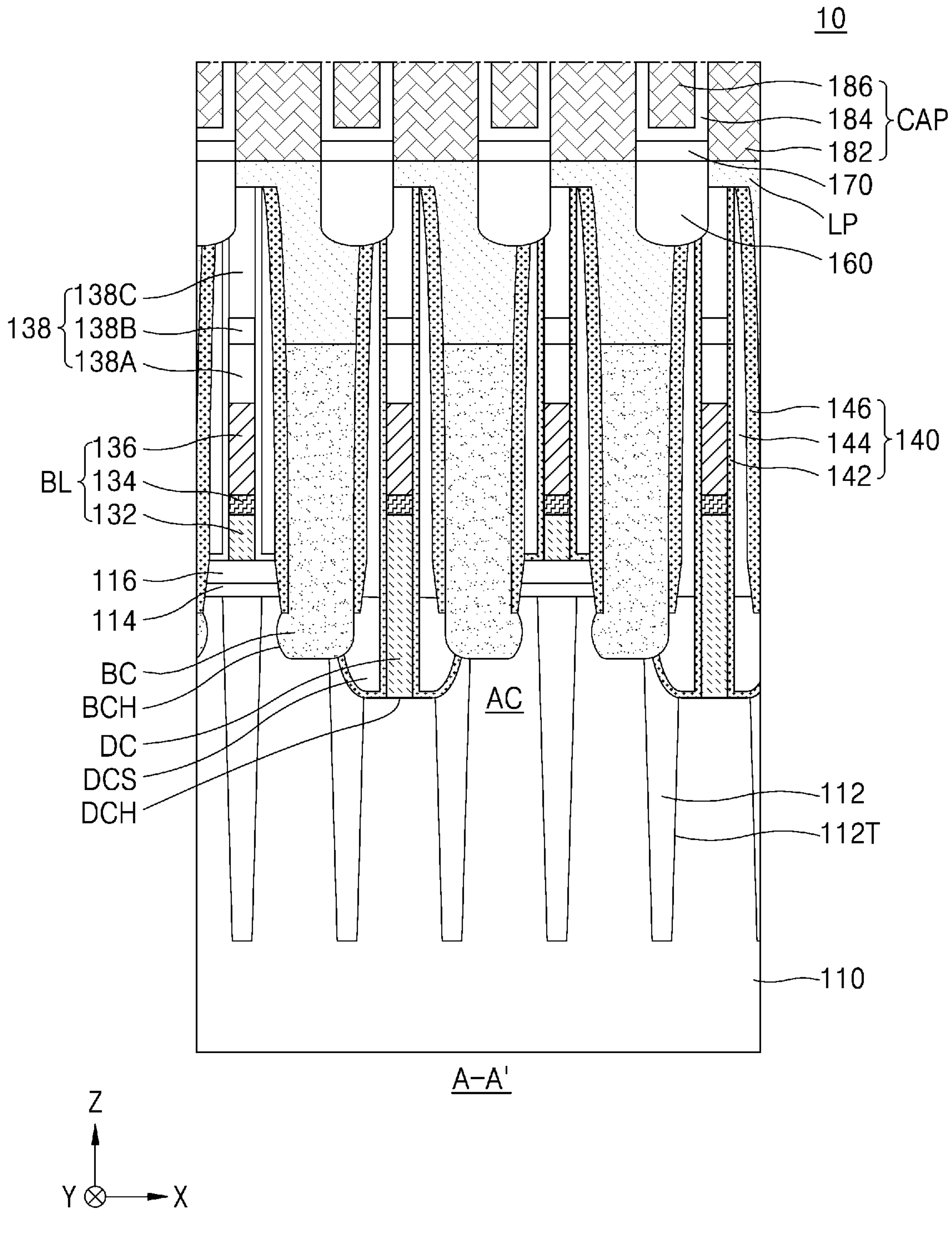
FIG. 2 is a cross-sectional view taken along the line from A to A' of FIG. 1 according to one or more example embodiments.
Figure 3:
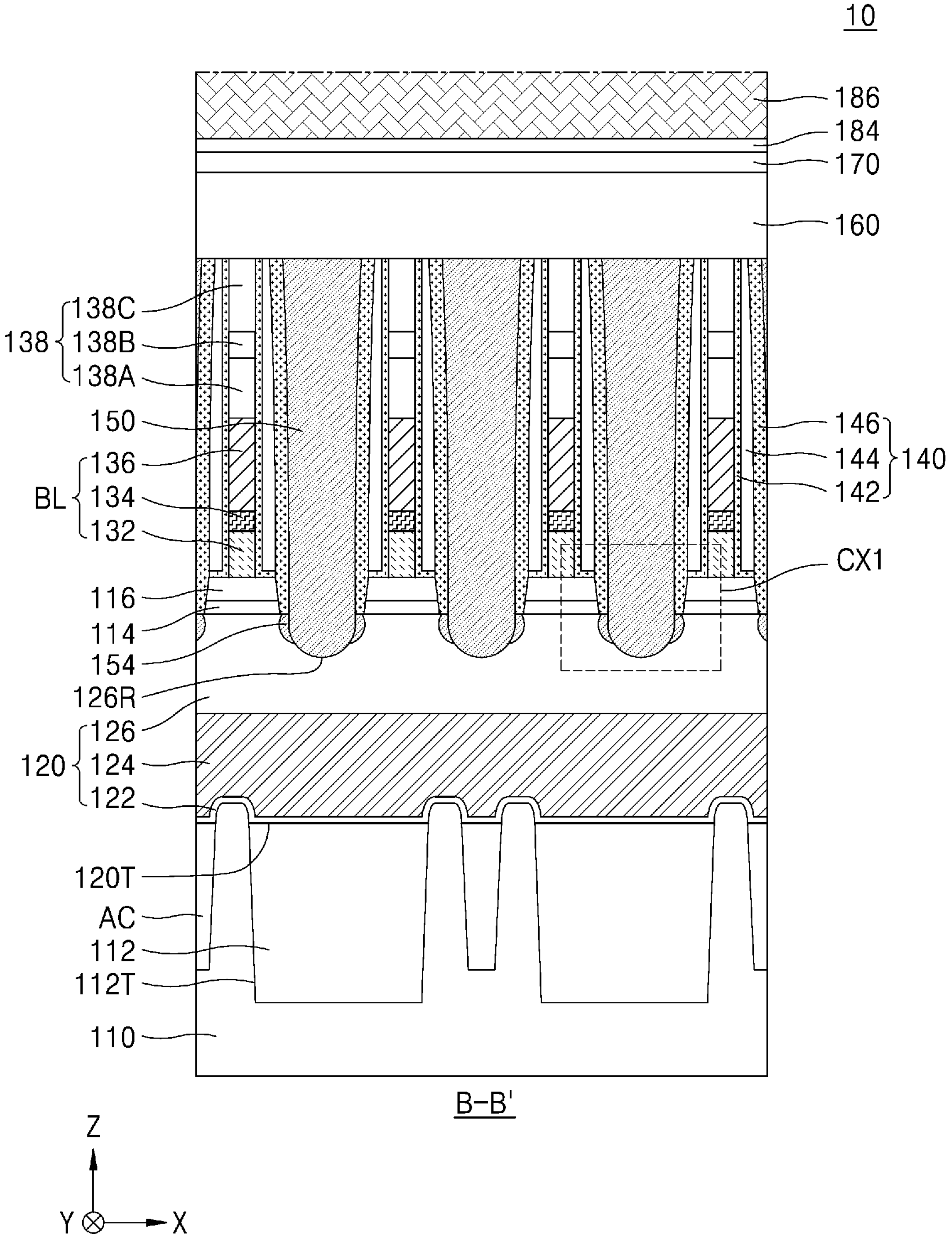
FIG. 3 is a cross-sectional view taken along the line from B to B' of FIG. 1 according to one or more example embodiments.
Figure 4:
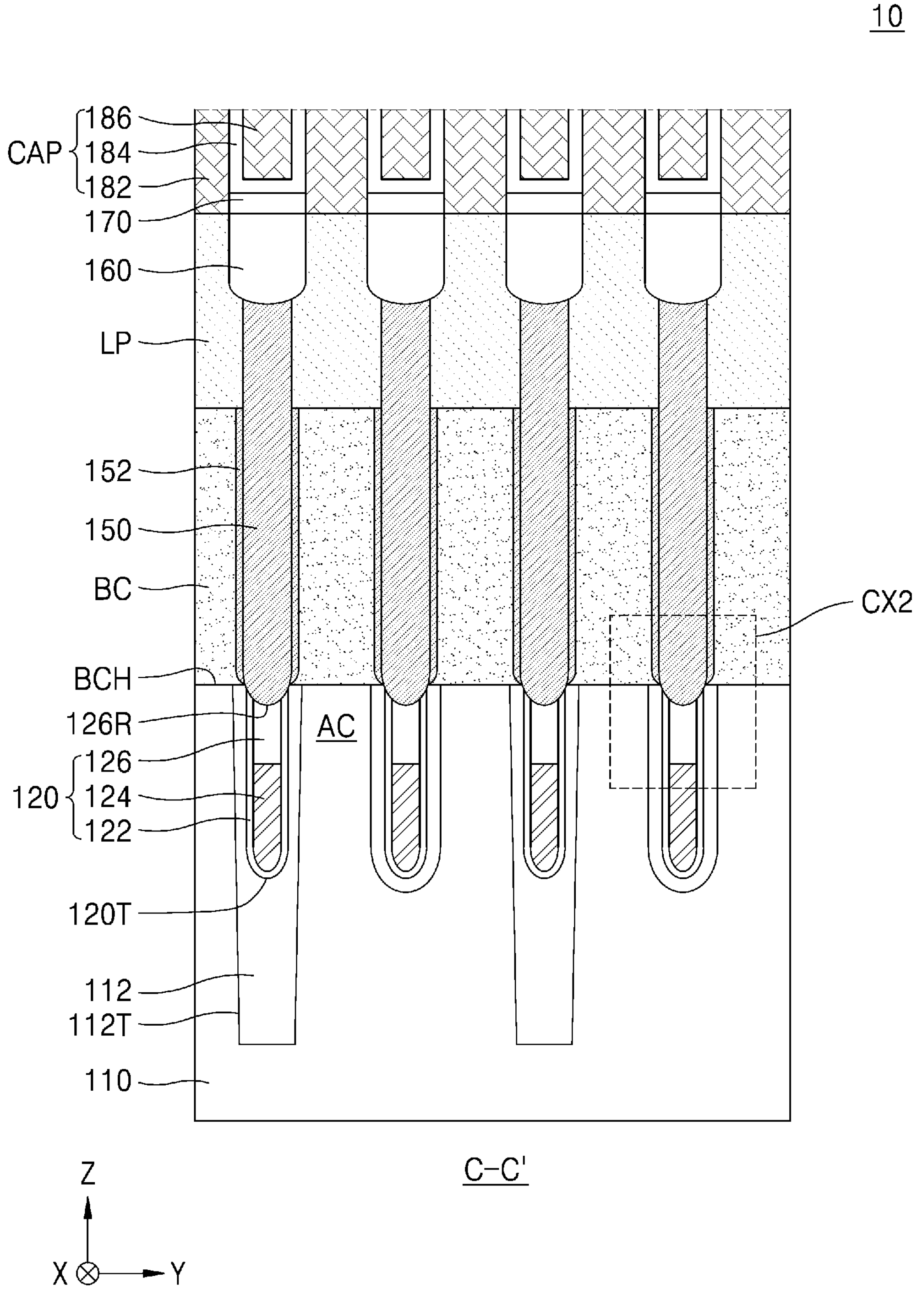
FIG. 4 is a cross-sectional view taken along the line from C to C' of FIG. 1 according to one or more example embodiments.
Figure 5:
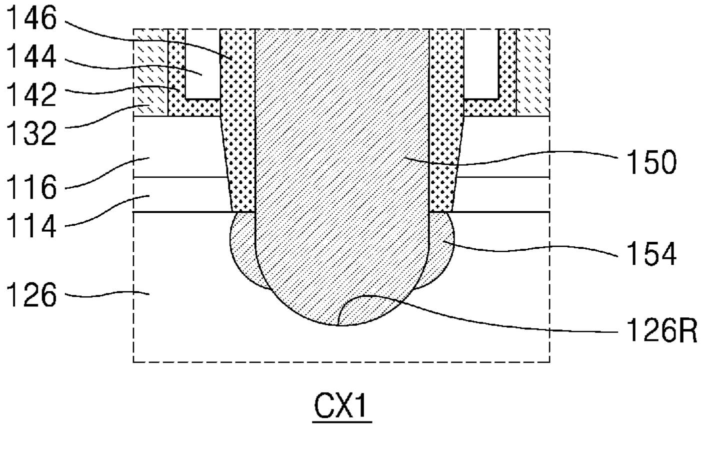
FIG. 5 is an enlarged view of region CX1 of FIG. 3 according to one or more example embodiments.
Figure 6:
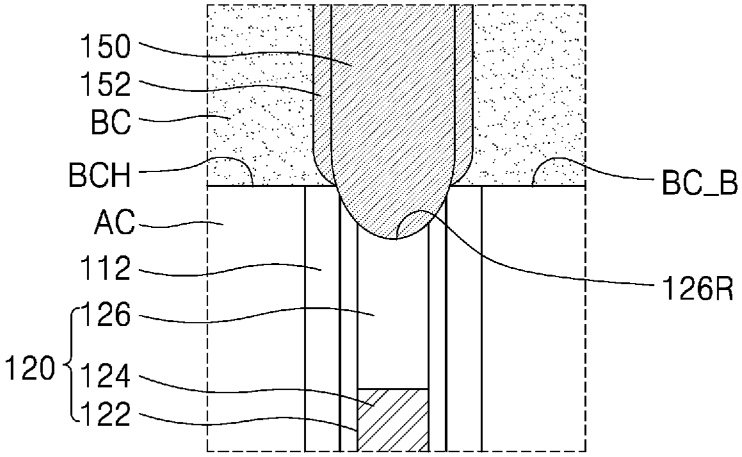
FIG. 6 is an enlarged view of region CX2 of FIG. 4 according to one or more example embodiments.

FIG. 1 is a layout diagram of an integrated circuit device according to one or more example embodiments. FIG. 2 is a cross-sectional view taken along the line from A to A' of FIG. 1 according to one or more example embodiments. FIG. 3 is a cross-sectional view taken along the line from B to B' of FIG. 1 according to one or more example embodiments. FIG. 4 is a cross-sectional view taken along the line from C to C' of FIG. 1 according to one or more example embodiments. FIG. 5 is an enlarged view of region CX1 of FIG. 3 according to one or more example embodiments. FIG. 6 is an enlarged view of region CX2 of FIG. 4 according to one or more example embodiments.

Referring to FIGS. 1, 2, 3, 4, 5 and 6, an integrated circuit device 10 may include a substrate 110 including a memory cell array region MCA and a peripheral circuit region.

Device isolation trenches 112T may be provided in the substrate 110, and device isolation layers 112 may be provided in the device isolation trenches 112T. A plurality of active regions AC may be defined on the substrate 110 by the device isolation layers 112.

The plurality of active regions AC may be provided to have long axes, which extend in a first oblique direction D1 inclined with respect to a first horizontal direction X and a second horizontal direction Y, respectively. A plurality of wordlines WL may extend parallel to each other along the first horizontal direction X across the plurality of active regions AC. A plurality of bitlines BL may extend parallel to each other along the second horizontal direction Y on the plurality of wordlines WL. The plurality of bitlines BL may be connected to the plurality of active regions AC through bitline contacts DC.

A plurality of buried contacts BC may be provided between two adjacent bitlines BL from among the plurality of bitlines BL. A plurality of landing pads LP may be provided on the plurality of buried contacts BC. The plurality of buried contacts BC and the plurality of landing pads LP may connect lower electrodes 182 of capacitor structures CAP provided on the plurality of bitlines BL to the plurality of active regions AC. Each of the plurality of landing pads LP may partially overlap the buried contact BC and the bitline BL.

The substrate 110 may include, but is not limited to, silicon, e.g., monocrystalline silicon, polycrystalline silicon, or amorphous silicon. In one or more example embodiments, the substrate 110 may include at least one selected from Ge, SiGe, SiC, GaAs, InAs, and InP. In one or more example embodiments, the substrate 110 may include a conductive region, e.g., a well doped with impurities or a structure doped with impurities.

The device isolation layers 112 may include, but are not limited to, silicon oxide, silicon nitride, or a combination thereof. A first buffer insulating layer 114 and a second buffer insulating layer 116 may be sequentially provided on a top surface of the substrate 110. Each of the first buffer insulating layer 114 and the second buffer insulating layer 116 may include, but are not limited to, silicon oxide, silicon oxynitride, or silicon nitride.

A plurality of wordline trenches 120T extending in the first horizontal direction X may be provided on the substrate 110, and a buried gate structure 120 may be provided in each of the plurality of wordline trenches 120T. The buried gate structure 120 may include a gate dielectric layer 122, a gate electrode 124, and a wordline capping layer 126 provided in each of the plurality of wordline trenches 120T. The gate electrodes 124 may correspond to the plurality of wordlines WL.

The plurality of gate dielectric layers 122 may include, but are not limited to, a silicon oxide layer, a silicon nitride layer, a silicon oxynitride layer, an oxide/nitride/oxide (ONO) layer, or a high-k dielectric film having a higher dielectric constant than the silicon oxide layer. The plurality of gate electrodes 124 may include, but are not limited to, Ti, TiN, Ta, TaN, W, WN, TiSiN, WSiN, or a combination thereof. The wordline capping layers 126 may include, but are not limited to, a silicon oxide layer, a silicon nitride layer, a silicon oxynitride layer, or a combination thereof. Undoped polysilicon or doped polysilicon may be added between the plurality of gate electrodes 124 and the plurality of wordline capping layers 126.

A plurality of bitline contact holes DCH may pass through the first buffer insulating layer 114 and the second buffer insulating layer 116 and extend into the substrate 110, and the bitline contacts DC may be provided in the plurality of bitline contact holes DCH. The bitline contacts DC may be connected to the plurality of active regions AC. The bitline contacts DC may include, but are not limited to, TiN, TiSiN, W, tungsten silicide, doped polysilicon, or a combination thereof. Bitline contact spacers DCS may cover a lower side of the bitline contact DC in the bitline contact hole DCH. The bitline contact spacers DCS may include, but are not limited to, silicon nitride.

The plurality of bitlines BL may extend along the second horizontal direction Y on the substrate 110 and the bitline contacts DC. The plurality of bitlines BL may be connected to the plurality of active regions AC through the bitline contacts DC, respectively. Each of the plurality of bitlines BL may include a lower conductive layer 132, a middle conductive layer 134, and a bitline conductive layer 136.

In one or more example embodiments, the lower conductive layer 132 may include, but is not limited to, polysilicon, and the middle conductive layer 134 may include, but is not limited to, at least one of TiN, TiSiN, cobalt silicide, nickel silicide, and tungsten silicide. The bitline conductive layer 136 may include, but is not limited to, at least one of ruthenium (Ru), tungsten (W), cobalt (Co), titanium (Ti), and titanium nitride (TiN).

A plurality of bitline capping layers 138 may be provided on the plurality of bitlines BL, respectively. Each of the bitline capping layers 138 may include a first capping layer 138A, a second capping layer 138B, and a third capping layer 138C sequentially provided on a top surface of the plurality of bitlines BL. The first capping layer 138A, the second capping layer 138B, and the third capping layer 138C may include, but are not limited to, at least one of silicon nitride, silicon oxide, and silicon oxynitride.

Spacers 140 may be provided on both sidewalls of each bitline BL. The spacers 140 may include a first spacer layer 142, a second spacer layer 144, and a third spacer layer 146. In one or more example embodiments, the first spacer layer 142 and the third spacer layer 146 may include, but are not limited to, silicon nitride, and the second spacer layer 144 may include, but is not limited to, silicon oxide. A bottom surface of the second spacer layer 144 may contact a top surface of the bitline contact spacer DCS.

Each of a plurality of buried contacts BC may be positioned between the two adjacent bitlines BL. For example, a bottom portion BC_B of the plurality of buried contacts BC may be provided in each of buried contact holes BCH extending into the substrate 110 between the two adjacent bitlines BL, and may contact the plurality of active regions AC. In one or more example embodiments, the plurality of buried contacts BC may include, but are not limited to, doped polysilicon.

A plurality of insulating fences 150 may be positioned between the two adjacent bitlines BL along the second horizontal direction Y. The plurality of insulating fences 150 may be provided at positions vertically overlapping the plurality of wordline trenches 120T. The plurality of insulating fences 150 may include, but are not limited to, silicon nitride. In plan view, the plurality of buried contacts BC and the plurality of insulating fences 150 may be alternately provided between the two bitlines BL extending in the second horizontal direction Y. The plurality of insulating fences 150 may be provided at positions corresponding to a plurality of recesses 126R each defined on a top surface of the plurality of wordline capping layers 126 within the wordline trenches 120T. For example, bottom portions of the plurality of insulating fences 150 may be provided in the plurality of recesses 126R.

The bottom portion BC_B of the plurality of buried contacts BC observed in a cross-sectional view along the first horizontal direction X may extend into the substrate 110 (or into the plurality of active regions AC and/or into the device isolation layers 112), and may have a rounded shape. The bottom portion BC_B of the plurality of buried contacts BC, observed in a cross-sectional view along the second horizontal direction Y, may extend into the substrate 110 (or into the plurality of active regions AC and/or into the device isolation layers 112), and may have a flat shape. Accordingly, the plurality of buried contacts BC may have a rounded bottom portion along the first horizontal direction X and a flat rectangular shape along the second horizontal direction Y.

Each of vertical insulating layers 152 may be positioned between the plurality of buried contacts BC and the plurality of insulating fences 150 alternately provided along the second horizontal direction Y. The vertical insulating layers 152 may extend from the same vertical level as a top surface of the plurality of buried contacts BC to the same vertical level as a bottom surface of the plurality of buried contacts BC. In one or more example embodiments, the vertical insulating layers 152 may be provided on lower sidewalls of the plurality of insulating fences 150 and may not be provided on upper sidewalls of the plurality of insulating fences 150. The vertical insulating layers 152 may be provided between the plurality of insulating fences 150 and the plurality of buried contacts BC. In one or more example embodiments, the vertical insulating layers 152 may also be provided between the insulating fence 150 and the bitline BL (e.g., between the insulating fence 150 and the third spacer layer 146).

The plurality of buried contacts BC may include a pair of first sidewalls spaced apart from each other in the first horizontal direction X and a pair of second sidewalls spaced apart from each other in a second horizontal direction Y, and the vertical insulating layers 152 may be provided on the pair of second sidewalls. In one or more example embodiments, the vertical insulating layers 152 may include, but are not limited to, silicon oxide or silicon nitride, e.g., silicon oxide provided on the sidewalls of the plurality of buried contacts BC by a selective oxidation process or silicon nitride provided by a selective nitridation process.

Each of residual insulating layers 154 may be provided on a sidewall of at least one insulating fence 150 among the plurality of insulating fences 150 in the plurality of recesses 126R. The residual insulating layers 154 may be provided on the sidewalls of the plurality of insulating fences 150 and below the spacers 140. In one or more example embodiments, the residual insulating layers 154 may include, but are not limited to, silicon oxide or silicon nitride, and may be provided, for example, by performing a selective oxidation process or a selective nitridation process on a portion of etch residues RD as shown according to one or more example embodiments in FIG. 11B where a portion of a preliminary contact layer PBC remains unremoved. The selective oxidation process may be a process using plasma radicals or a thermal oxidation process, but is not limited thereto. In addition, the selective nitridation process may be a process using plasma radicals or a thermal nitridation process, but is not limited thereto.

Accordingly, the residual insulating layers 154 may be provided of substantially the same material as the vertical insulating layers 152, and may be connected to the vertical insulating layers 152. That is, in the integrated circuit device 10 of one or more example embodiments, the plurality of insulating fences 150 may form an integral structure with the vertical insulating layers 152 and the residual insulating layers 154.

In plan view, each of the residual insulating layers 154 may be positioned between the two adjacent buried contacts BC in the second horizontal direction Y from among the plurality of buried contacts BC. For example, the residual insulating layers 154 may be connected to the first buried contact BC of the two buried contacts BC adjacent to a first end of the residual insulating layers 154 and the second buried contact BC of the two buried contacts BC adjacent to a second end of the residual insulating layers 154.

The plurality of landing pads LP may be provided on the plurality of buried contacts BC. Each of the plurality of landing pads LP may include a conductive barrier layer and a landing pad conductive layer. The conductive barrier layer may include, but is not limited to, Ti, TiN, or a combination thereof. The landing pad conductive layer may include, but is not limited to, metal, metal nitride, conductive polysilicon, or a combination thereof. For example, the landing pad conductive layer may include, but is not limited to, tungsten (W). The plurality of landing pads LP may have a plurality of island-shaped pattern shapes in plan view. Each of the plurality of landing pads LP may contact the top surface of the buried contact BC and the top surface of the vertical insulating layer 152. Each of the plurality of landing pads LP may also contact the upper sidewall of the insulating fence 150.

The plurality of landing pads LP may contact sidewalls of the plurality of insulating fences 150, and the vertical insulating layers 152 may not be positioned between the plurality of landing pads LP and the plurality of insulating fences 150.

The plurality of landing pads LP may be electrically insulated from each other by the insulating patterns 160 surrounding the plurality of landing pads LP. The insulating patterns 160 may include, but are not limited to, at least one of silicon nitride, silicon oxide, and silicon oxynitride. In one or more example embodiments, upper insulating patterns 170 may be provided on the insulating patterns 160.

The capacitor structures CAP may be provided on the plurality of landing pads LP. The capacitor structures CAP may include a lower electrode 182, a capacitor dielectric layer 184, and an upper electrode 186.

In general, a plurality of insulating fences are first provided in a space between the plurality of bitlines BL, and a plurality of buried contact holes BCH are provided by using the plurality of bitlines BL and the insulating fences as an etching mask. However, as the width of the buried contact holes BCH is small and the aspect ratio thereof is increased, defects occur in an etching process.

In order to address this disadvantage, according to one or more example embodiments, a portion of the substrate 110 exposed to the space between the plurality of bitlines BL may be removed to provide the line-type or trench-type buried contact holes BCH, provide the preliminary contact layer PBC which fills the space between the plurality of bit lines BL, and provide the plurality of buried contacts BC by patterning the same. In addition, the vertical insulating layers 152 may be provided by performing a selective oxidation process or a selective nitridation process on the exposed side surfaces of the plurality of buried contacts BC, and the plurality of insulating fences 150 filling the space between the plurality of buried contacts BC may be provided. Therefore, polysilicon residues remaining in the process of removing the preliminary contact layer may be oxidized in the selective oxidation process or nitrided in the selective nitridation process, thereby reducing or preventing defects of bridges between the buried contacts BC.

Ultimately, the integrated circuit device 10 according to one or more example embodiments may have excellent electrical characteristics and high productivity.

Figure 7:
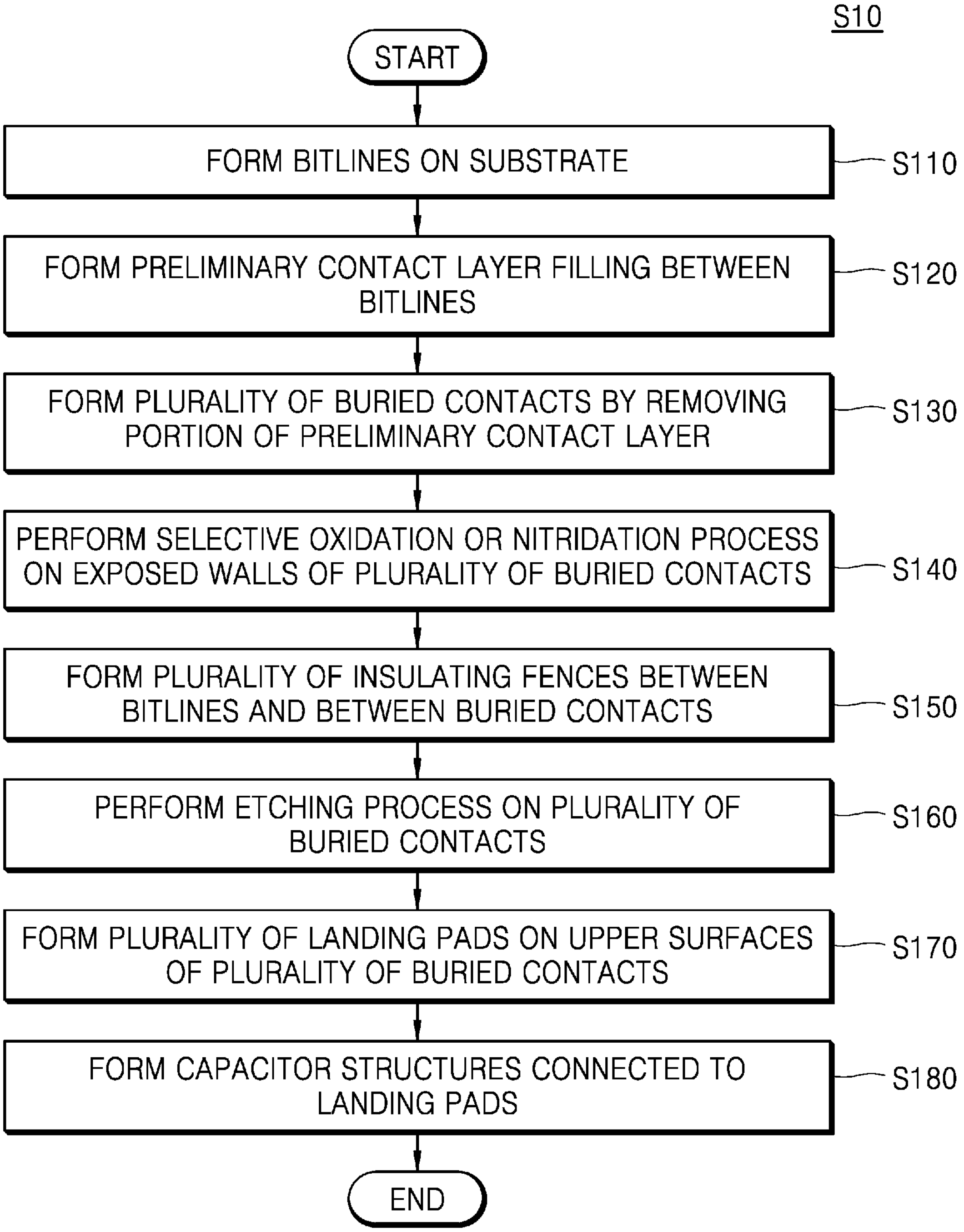
FIG. 7 is a flowchart illustrating a method of manufacturing an integrated circuit device according to one or more example embodiments.

FIG. 7 is a flowchart illustrating a method of manufacturing an integrated circuit device according to one or more example embodiments.

Referring to one or more example embodiments shown in FIG. 7, a method S10 of manufacturing an integrated circuit device may include a process sequence of first to eighth operations S110, S120, S130, S140, S150, S160, S170 and S180.

When one or more example embodiments can be implemented differently, a specific process sequence may be performed differently from the described sequence of one or more example embodiments shown in FIG. 7. For example, according to one or more example embodiments, two processes described in succession may be performed substantially simultaneously, or may be performed in an order different from the order described.

The method S10 of manufacturing a semiconductor memory device according to one or more example embodiments may include: a first operation S110 of forming the plurality of bitlines on the substrate; a second operation S120 of forming the preliminary contact layer which fills between the plurality of bitlines; a third operation S130 of forming the plurality of buried contacts by removing a portion of the preliminary contact layer; a fourth operation S140 of performing a selective oxidation process or a selective nitridation process on the exposed sidewalls of the plurality of buried contacts; a fifth operation S150 of forming the plurality of insulating fences between the plurality of bitlines and between the plurality of buried contacts; a sixth operation S160 of performing an etching process on the upper sides of the plurality of buried contacts; a seventh operation S170 of forming the plurality of landing pads on the upper surfaces of the plurality of buried contacts; and an eighth operation of forming the capacitor structures connected to the plurality of landing pads.

The technical characteristics of each of the first to eighth operations S110, S120, S130, S140, S150, S160, S170 and S180 will be described in detail below with reference to one or more example embodiments shown in FIGS. 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B and 15C.

FIGS. 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B and 15C are cross-sectional views illustrating a method of manufacturing an integrated circuit device 10 according to one or more example embodiments.

Specifically, FIGS. 8A, 9A, 10A, 11A, 12A, 13A, 14A, and 15A are cross-sectional views corresponding to the line from A to A' in FIG. 1 according to one or more example embodiments, FIGS. 8B, 9B, 10B, 11B, 12B, 13B, 14B, and 15B are cross-sectional views corresponding to the line from B to B' in FIG. 1 according to one or more example embodiments, and FIGS. 8C, 9C, 10C, 11C, 12C, 13C, 14C, and 15C are cross-sectional views corresponding to the line from C to C' in FIG. 1 according to one or more example embodiments.

Figure 8A:
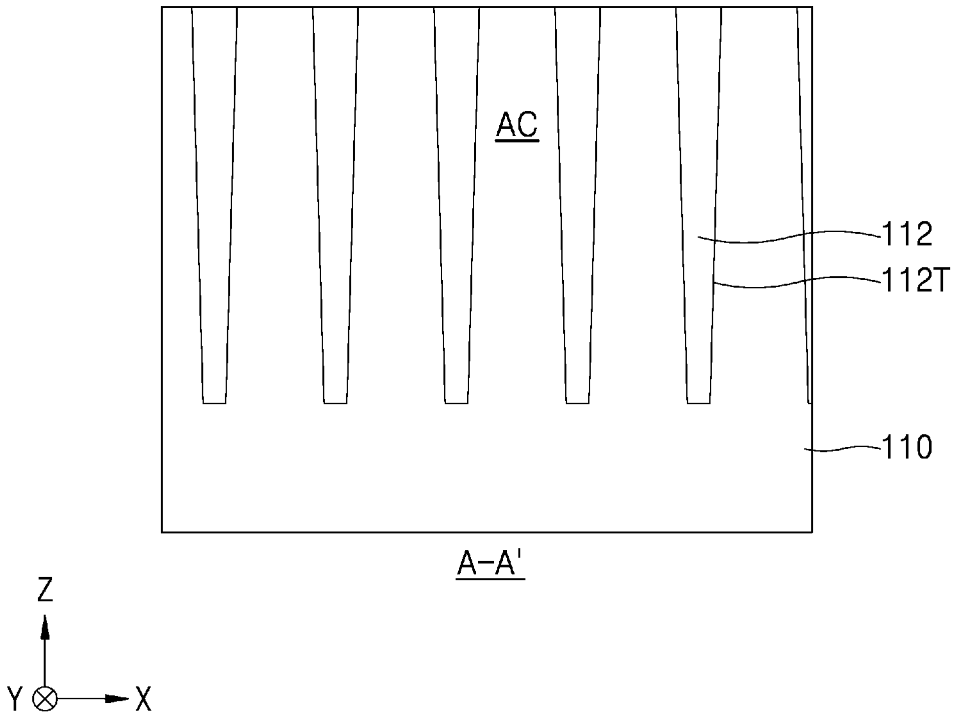
FIGS. 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B and 15C are cross-sectional views illustrating a method of manufacturing an integrated circuit device according to one or more example embodiments.
Figure 8B:
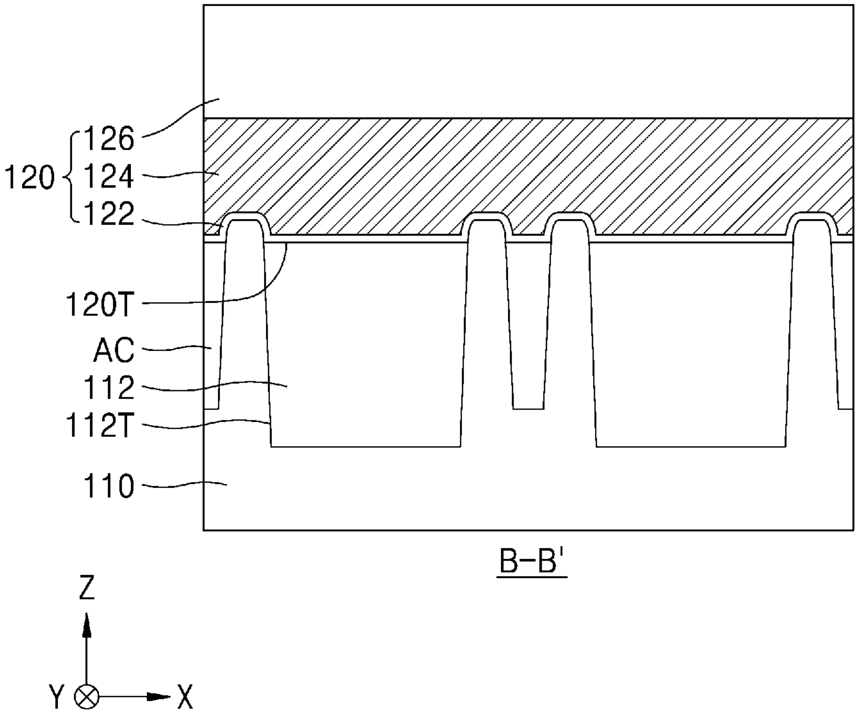
Figure 8C:
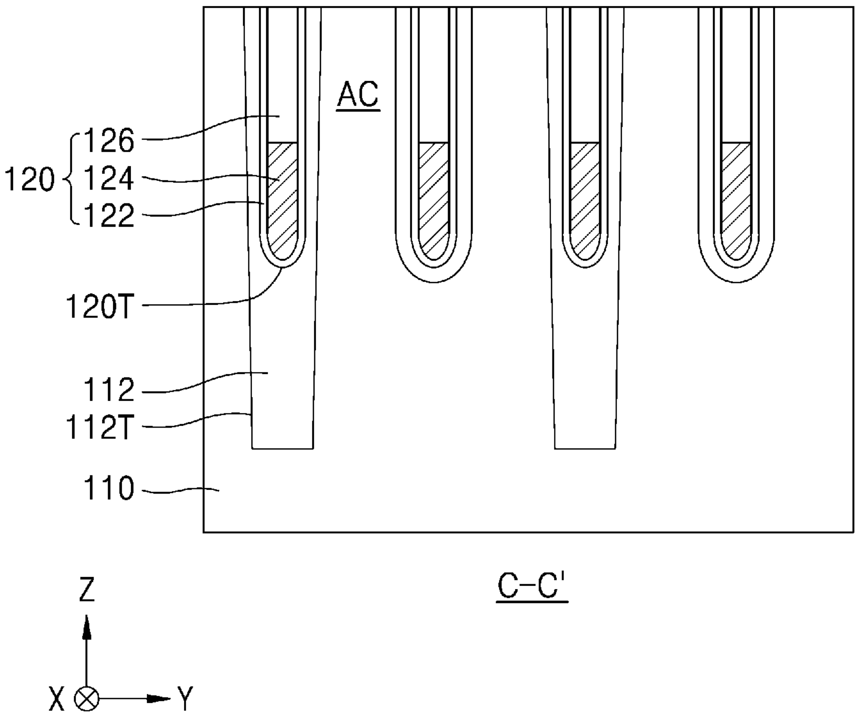

Referring to one or more example embodiments shown in FIGS. 8A, 8B and 8C, the plurality of device isolation trenches 112T may be provided in the substrate 110.

In addition, the device isolation layers 112 filling the plurality of device isolation trenches 112T may be provided. The plurality of first active regions AC are defined on the substrate 110 by forming the device isolation layers 112. The plurality of first active regions AC may extend along the first oblique direction D1 inclined at a predefined angle with respect to the first horizontal direction X and the second horizontal direction Y.

In one or more example embodiments, the device isolation layers 112 may be provided using silicon oxide, silicon nitride, silicon oxynitride, or a combination thereof. In one or more example embodiments, the device isolation layers 112 may be provided in a double layer structure of a silicon oxide layer and a silicon nitride layer, but are not limited thereto.

A mask pattern may be provided on the substrate 110, and wordline trenches 120T may be provided by removing a portion of the substrate 110 using the mask pattern as an etching mask. For example, the mask pattern for forming the wordline trenches 120T may be provided using a double patterning technique (DPT) or a quadruple patterning technique (QPT), but one or more example embodiments are not limited thereto.

In addition, the gate dielectric layers 122, the gate electrodes 124, and the wordline capping layers 126 may be sequentially provided in the wordline trenches 120T.

For example, the gate dielectric layers 122 may be conformally provided on inner walls of the wordline trenches 120T. The gate electrodes 124 may be provided by filling the wordline trenches 120T with conductive layers and then exposing upper portions of the wordline trenches 120T again by etching back upper portions of the conductive layers.

Figure 9A:
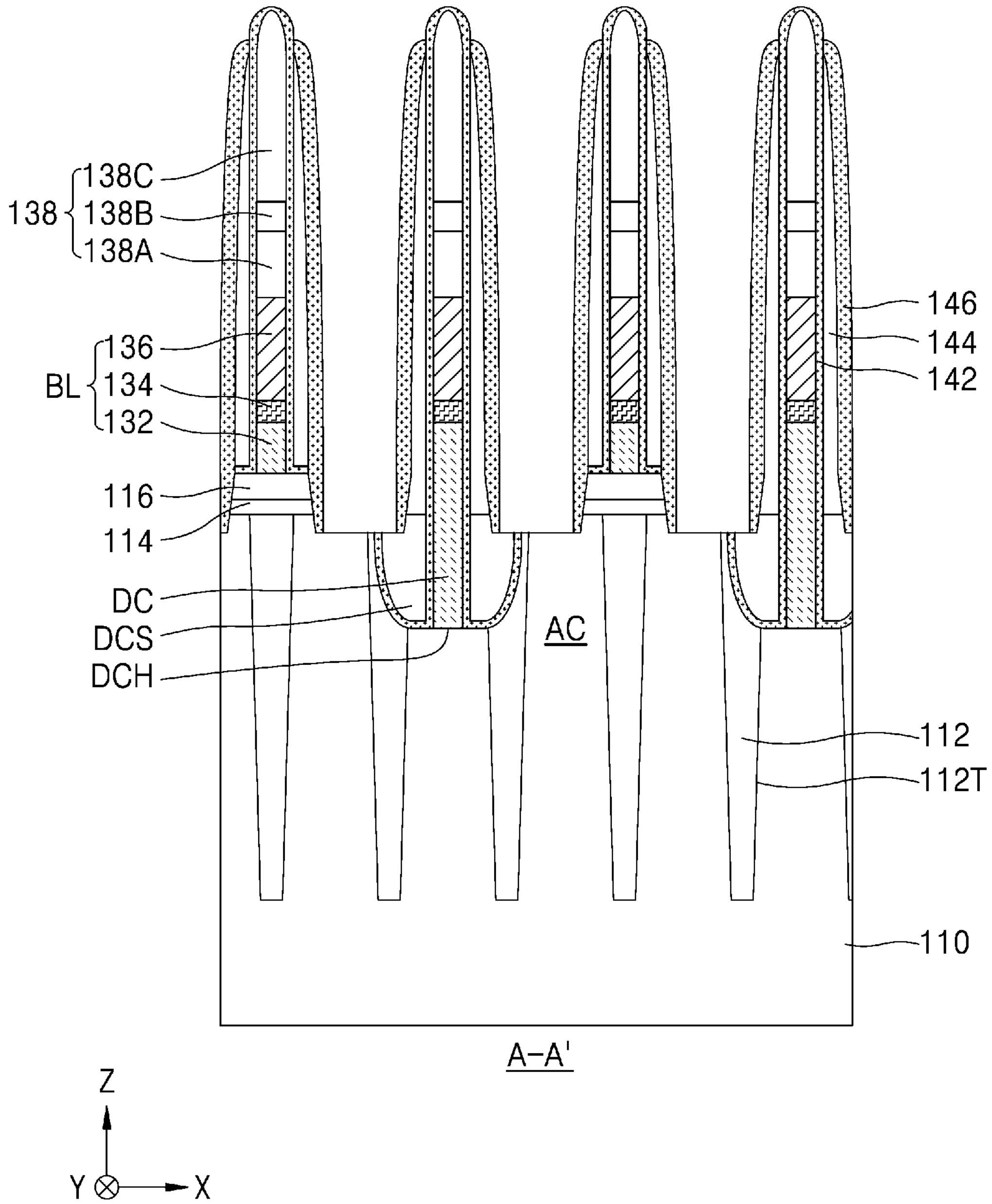
Figure 9B:
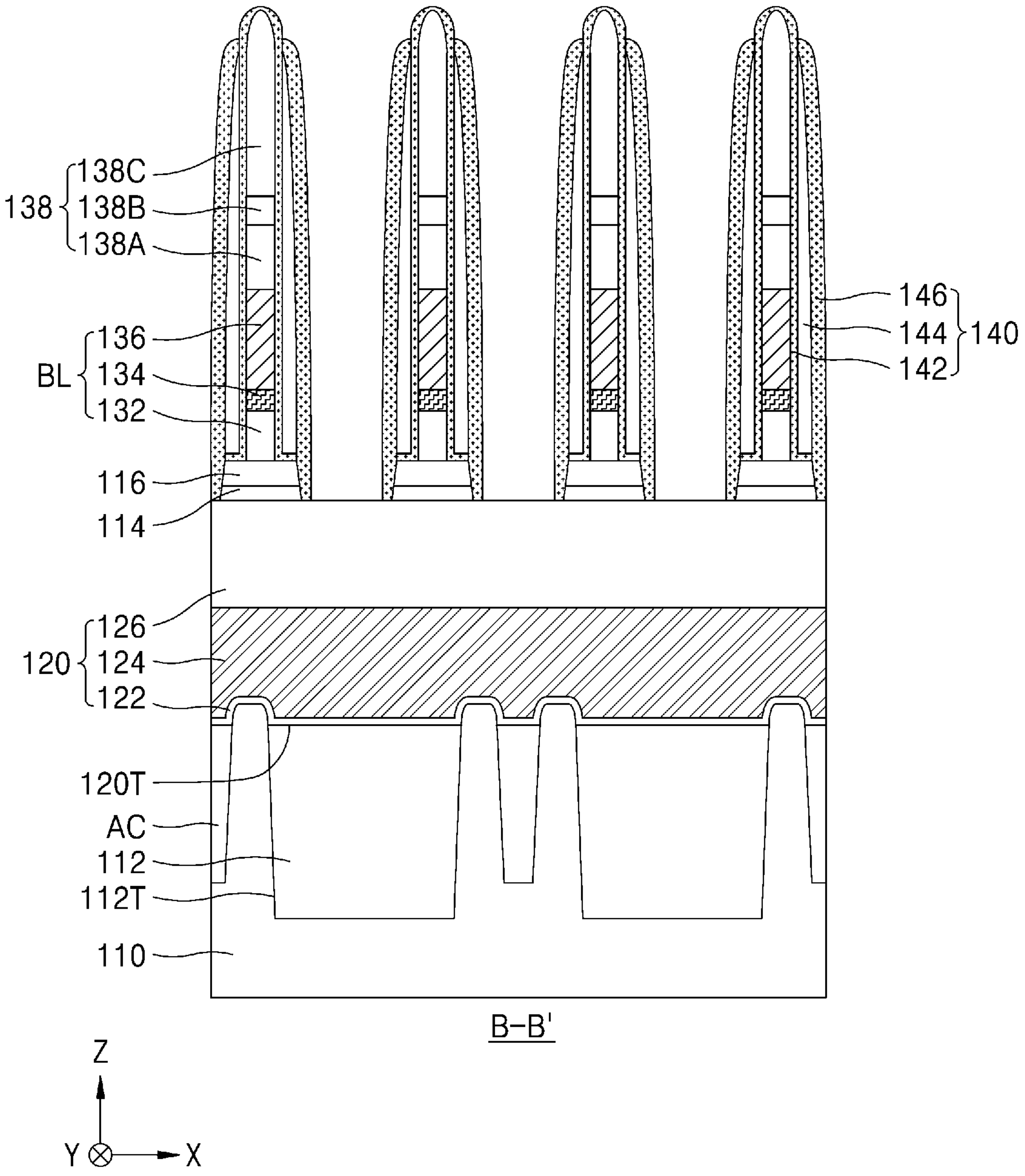
Figure 9C:
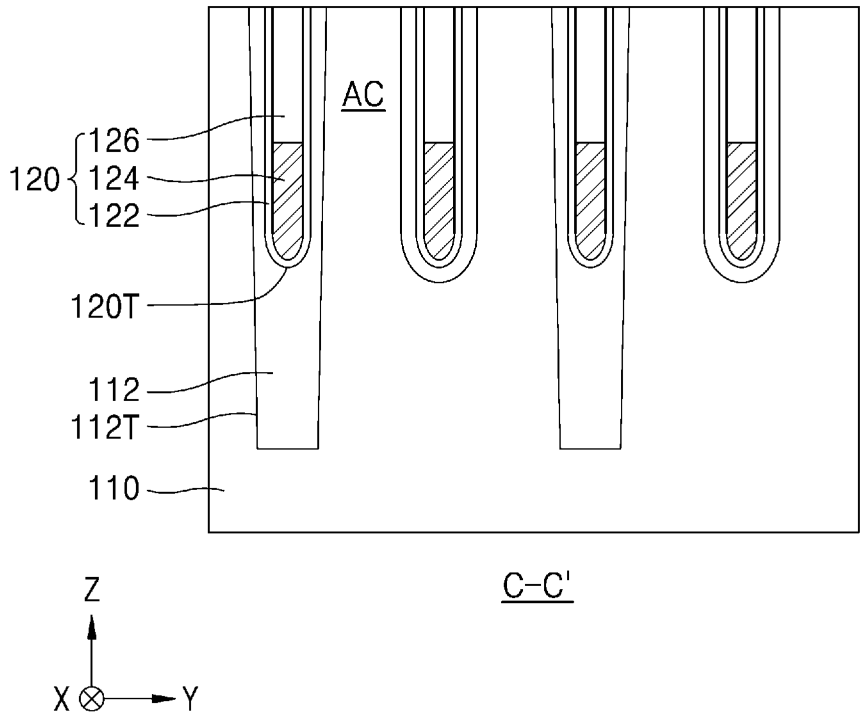

Referring to one or more example embodiments shown in FIGS. 9A, 9B and 9C, the first buffer insulating layer 114 and the second buffer insulating layer 116 may be provided on the active region AC and the device isolation layer 112.

In addition, the lower conductive layer 132 may be provided on the first and second buffer insulating layers 114 and 116, and the plurality of bitline contact holes DCH may be provided by removing portions of the lower conductive layer 132, the first and second buffer insulating layers 114 and 116, and the substrate 110. In addition, the bitline contacts DC may be provided inside the plurality of bitline contact holes DCH.

The middle conductive layer 134 and the bitline conductive layer 136 may be provided on the bitline contact DC and the lower conductive layer 132, and the bitline capping layer 138 may be provided on the bitline conductive layer 136. The plurality of bitlines BL may be provided by patterning the bitline conductive layer 136, the middle conductive layer 134, and the lower conductive layer 132 using the bitline capping layer 138 as an etching mask.

In one or more example embodiments, the middle conductive layer 134 may include, but is not limited to, at least one of TiN, TiSiN, cobalt silicide, nickel silicide, and tungsten silicide. The bitline conductive layer 136 may include, but is not limited to, at least one of ruthenium (Ru), tungsten (W), cobalt (Co), titanium (Ti), and titanium nitride (TiN).

In addition, the first spacer layer 142, the second spacer layer 144, and the third spacer layer 146 may be sequentially provided on the sidewalls of the bitline BL and the bitline capping layer 138. In one or more example embodiments, the first spacer layer 142 and the third spacer layer 146 may include, but are not limited to, silicon nitride, and the second spacer layer 144 may include silicon oxide.

In one or more example embodiments, an anisotropic etching process or a trimming process may be performed on the first spacer layer 142 after forming the first spacer layer 142 on the sidewalls of the bitline BL and the bitline capping layer 138 so that the top surface of the first spacer layer 142 and the top surface of the bitline capping layer 138 may have a rounded shape. In addition, the second spacer layer 144 may be provided on the sidewall of the first spacer layer 142, and an anisotropic etching process or a trimming process may be performed on the second spacer layer 144. The third spacer layer 146 may be provided on the sidewall of the second spacer layer 144, and an anisotropic etching process or a trimming process may be performed on the third spacer layer 146. As a result of the anisotropic etching process or the trimming process, the upper widths of the second spacer layer 144 and the third spacer layer 146 may be smaller than the lower widths of the second spacer layer 144 and the third spacer layer 146, and the upper surfaces of the second spacer layer 144 and the third spacer layer 146 may have a rounded shape.

In one or more example embodiments, in the process of forming the spacers 140, the bitline contact spacers DCS may be provided by filling the bitline contact holes DCH with insulating material. The bitline contact spacers DCS may include, but are not limited to, silicon oxide filling the inside of the bitline contact holes DCH. The bitline contact spacers DCS may further include a portion of the first spacer layer 142 extending into the bitline contact holes DCH.

Figure 10A:
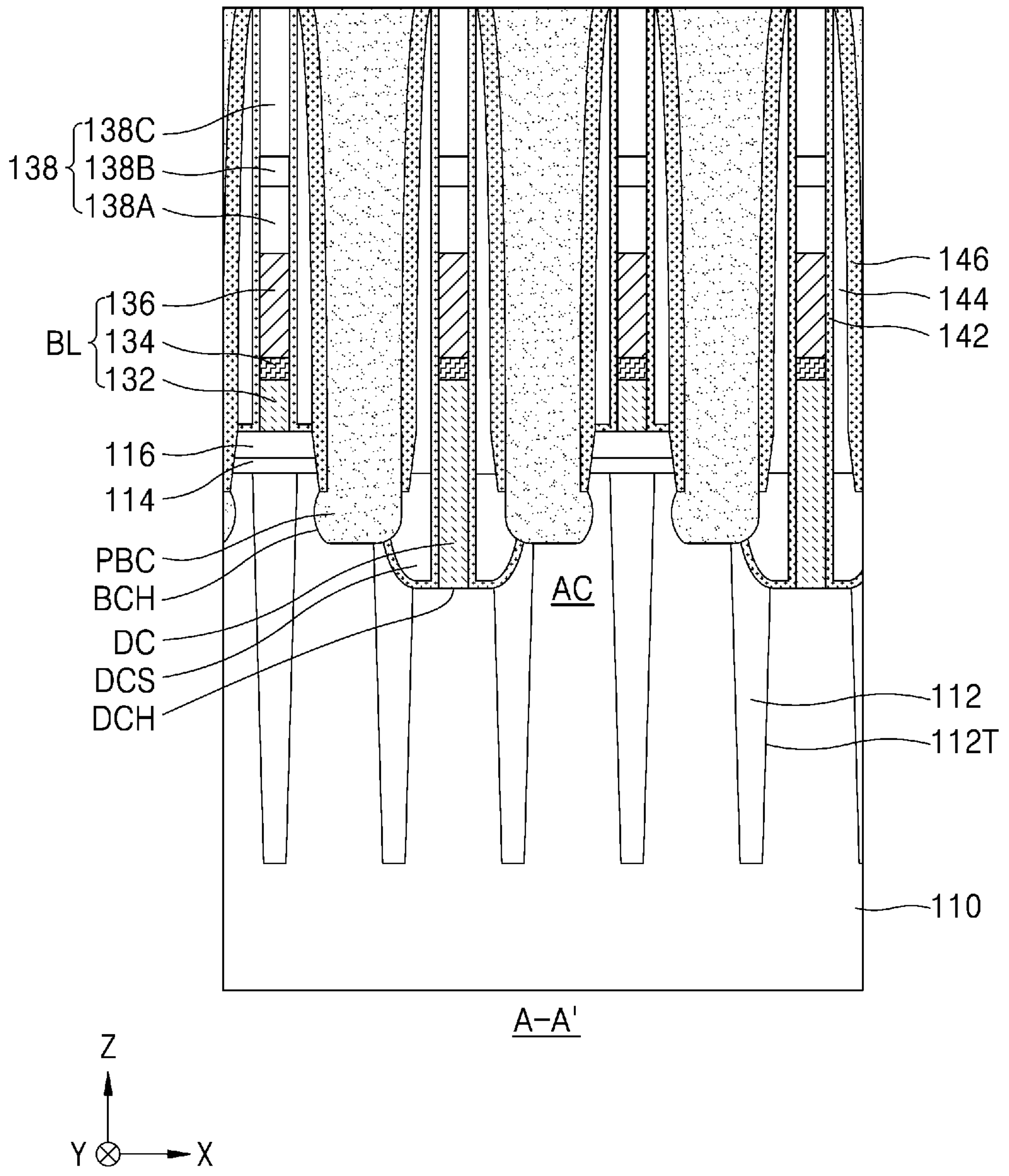
Figure 10B:
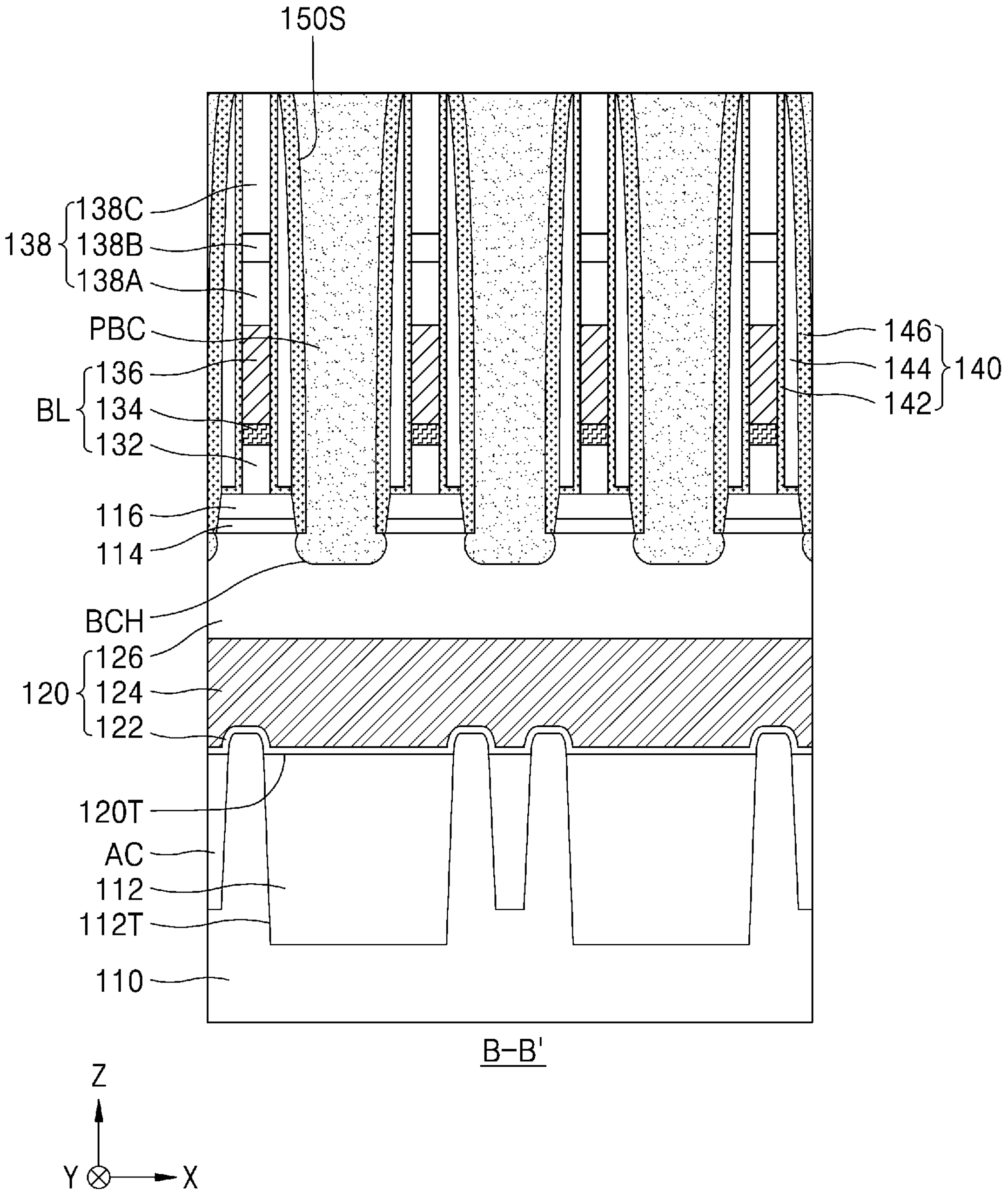
Figure 10C:
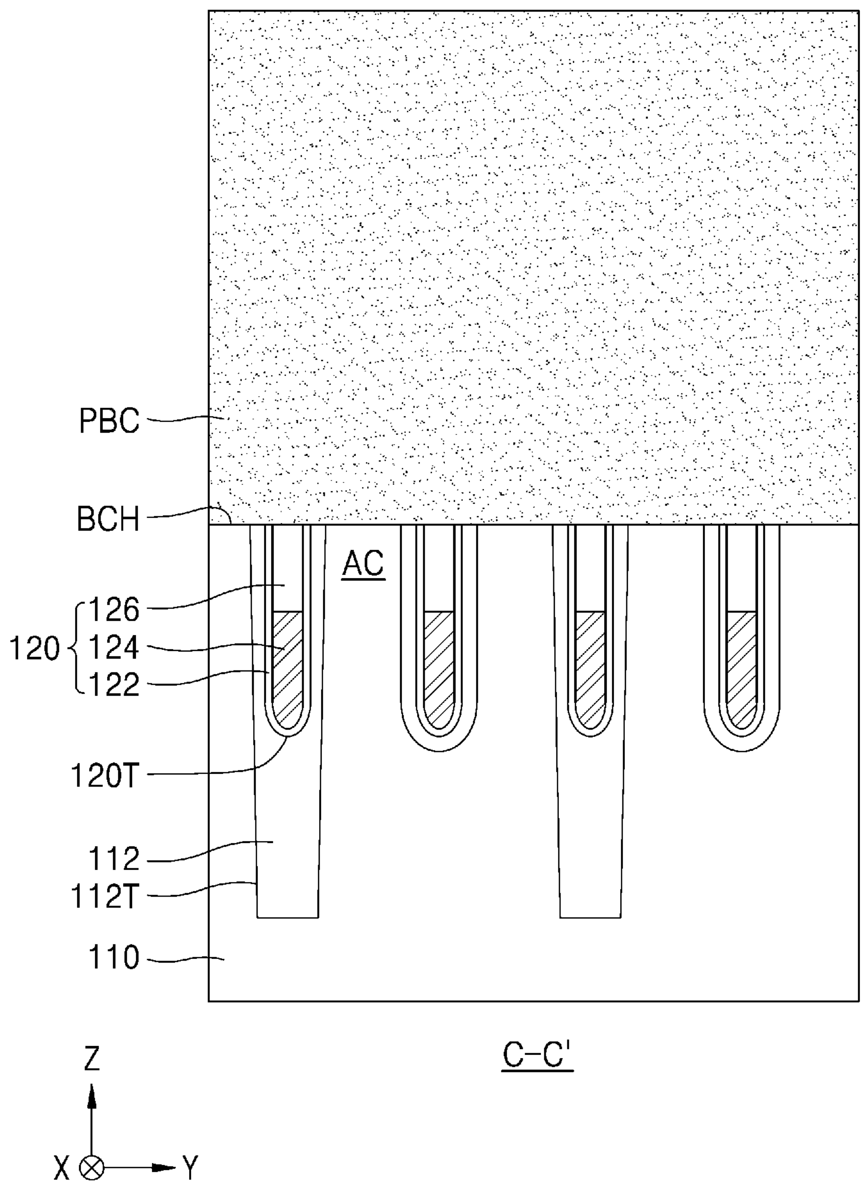

Referring to one or more example embodiments shown in FIGS. 10A, 10B and 10C, the upper side of the substrate 110 exposed to the space between the plurality of bitlines BL may be further removed to provide the buried contact holes BCH.

In one or more example embodiments, the formation process of the buried contact holes BCH may include a wet etching process, a dry etching process, or a combination thereof. In the process of forming the buried contact holes BCH, a portion of the wordline capping layer 126 exposed to the space between the plurality of bitlines BL may also be removed, and thus each of the buried contact holes BCH may be provided on the upper surfaces of the wordline capping layer 126. In one or more example embodiments, the buried contact holes BCH may extend laterally with respect to a sidewall of the third spacer layer 146, and, for example, to at least a portion of the lower region of the third spacer layer 146.

In addition, the preliminary contact layer PBC filling the inside of the buried contact holes BCH may be provided. The preliminary contact layer PBC may be provided to extend along the second horizontal direction Y. For example, a bottom surface of the preliminary contact layer PBC may be positioned at a flat level along the second horizontal direction Y. In one or more example embodiments, a bottom portion of the preliminary contact layer PBC may fill the inside of the buried contact holes BCH provided on the wordline capping layers 126.

Figure 11A:
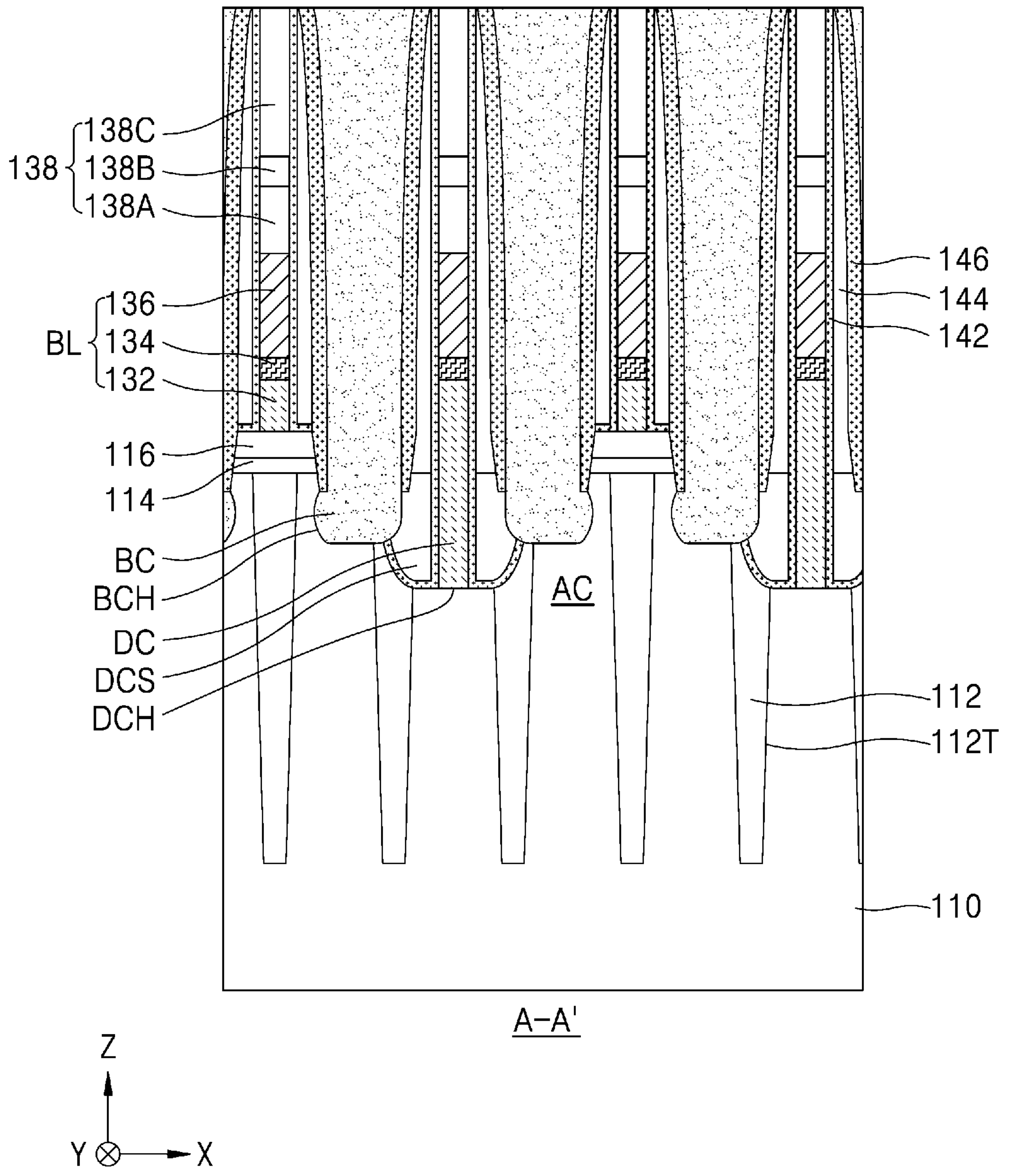
Figure 11B:
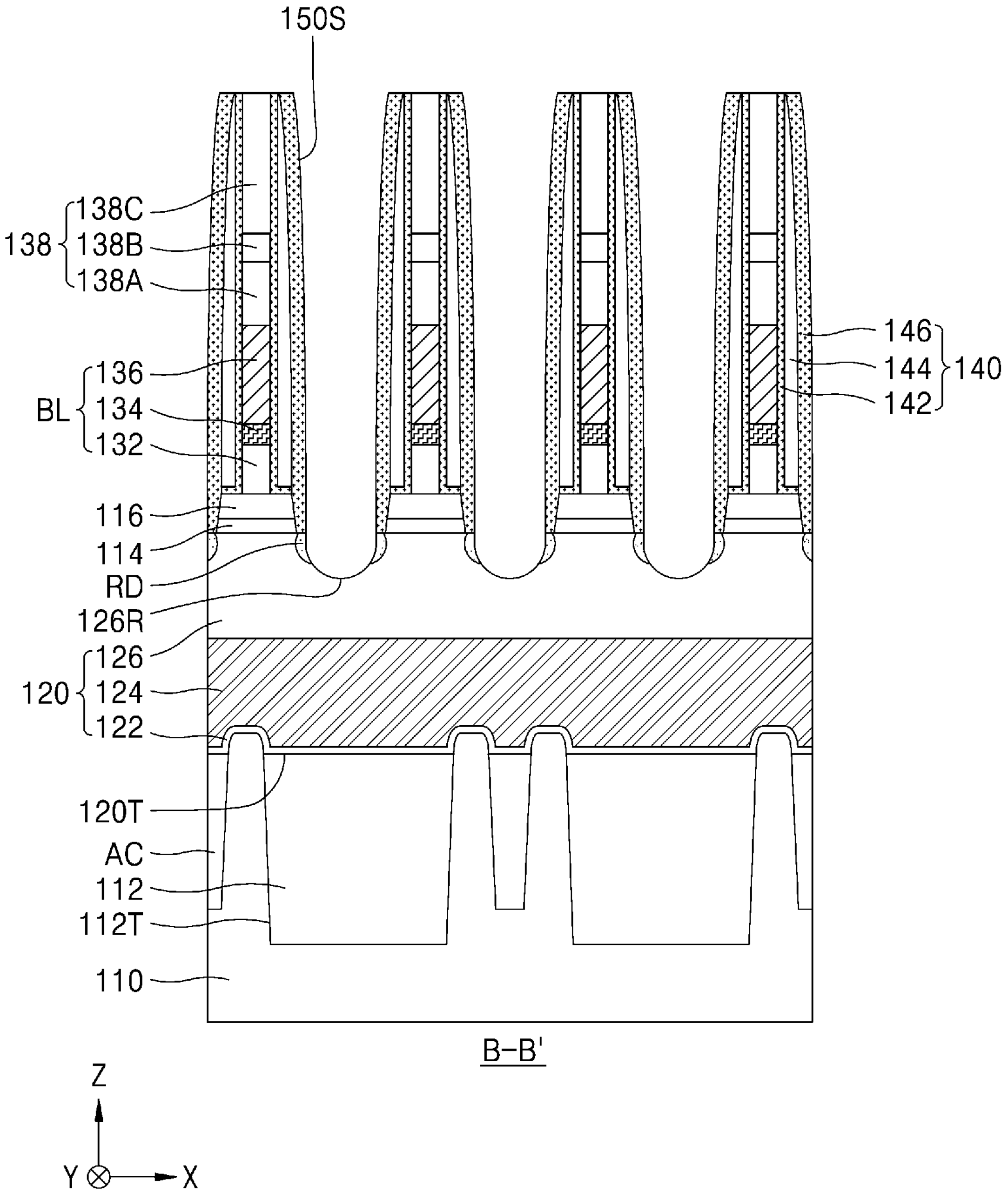
Figure 11C:
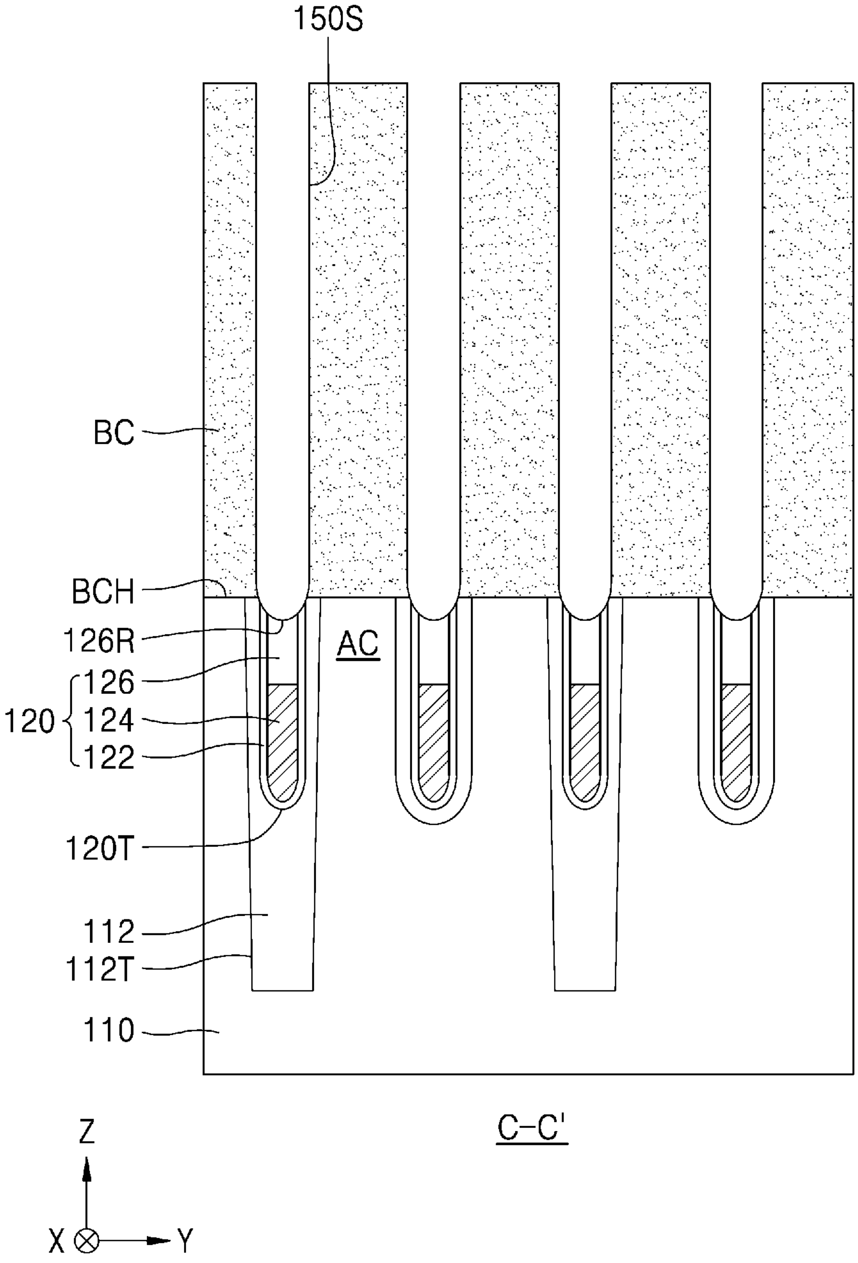

Referring to FIGS. 11A, 11B and 11C, the plurality of buried contacts BC may be provided by removing a portion of the preliminary contact layer PBC.

The plurality of buried contacts BC may be spaced apart from each other in the first horizontal direction X and the second horizontal direction Y, and may be connected to the upper surfaces of the active regions AC.

In one or more example embodiments, a portion of the preliminary contact layer PBC removed to provide the plurality of buried contacts BC may be provided at positions corresponding to the plurality of recesses 126R. Accordingly, after the plurality of buried contacts BC are provided, the upper surface of the wordline capping layer 126 may be exposed again to the bottom of the space between the plurality of buried contacts BC by the plurality of recesses 126R.

In the etching process for forming the plurality of buried contacts BC, a portion of the preliminary contact layer PBC may remain in the plurality of recesses 126R without being removed, which may be referred to as the etch residues RD. In one or more example embodiments, the etch residues RD may be positioned below the third spacer layer 146 and in the plurality of recesses 126R, and may be connected to two adjacent buried contacts BC in the second horizontal direction Y. For example, one end of the etch residues RD may be connected to the one buried contact BC from among the two adjacent buried contacts BC, and the other end of the etch residues RD may be connected to the other buried contact BC from among the two adjacent buried contacts BC.

Figure 12A:
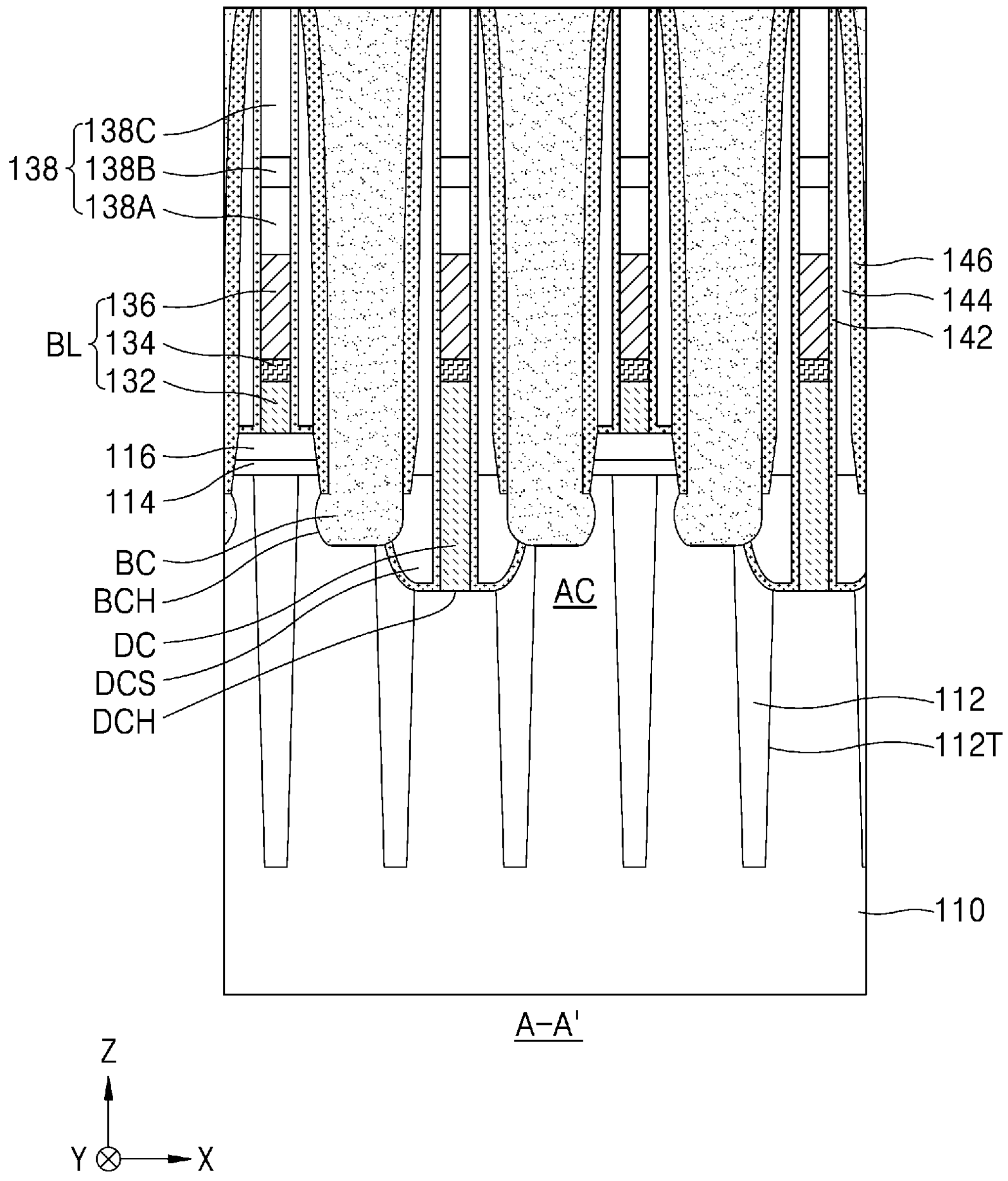
Figure 12B:
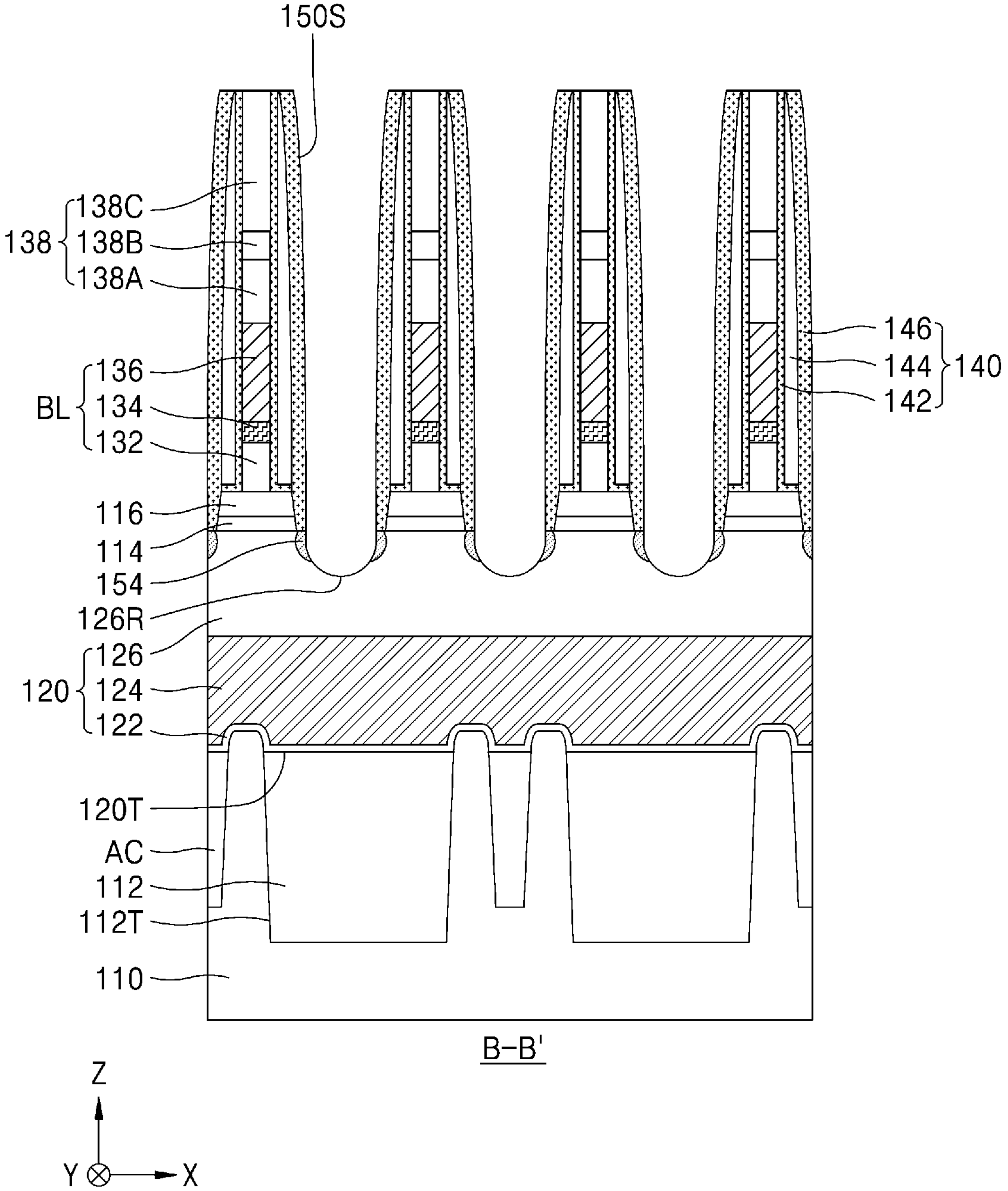
Figure 12C:
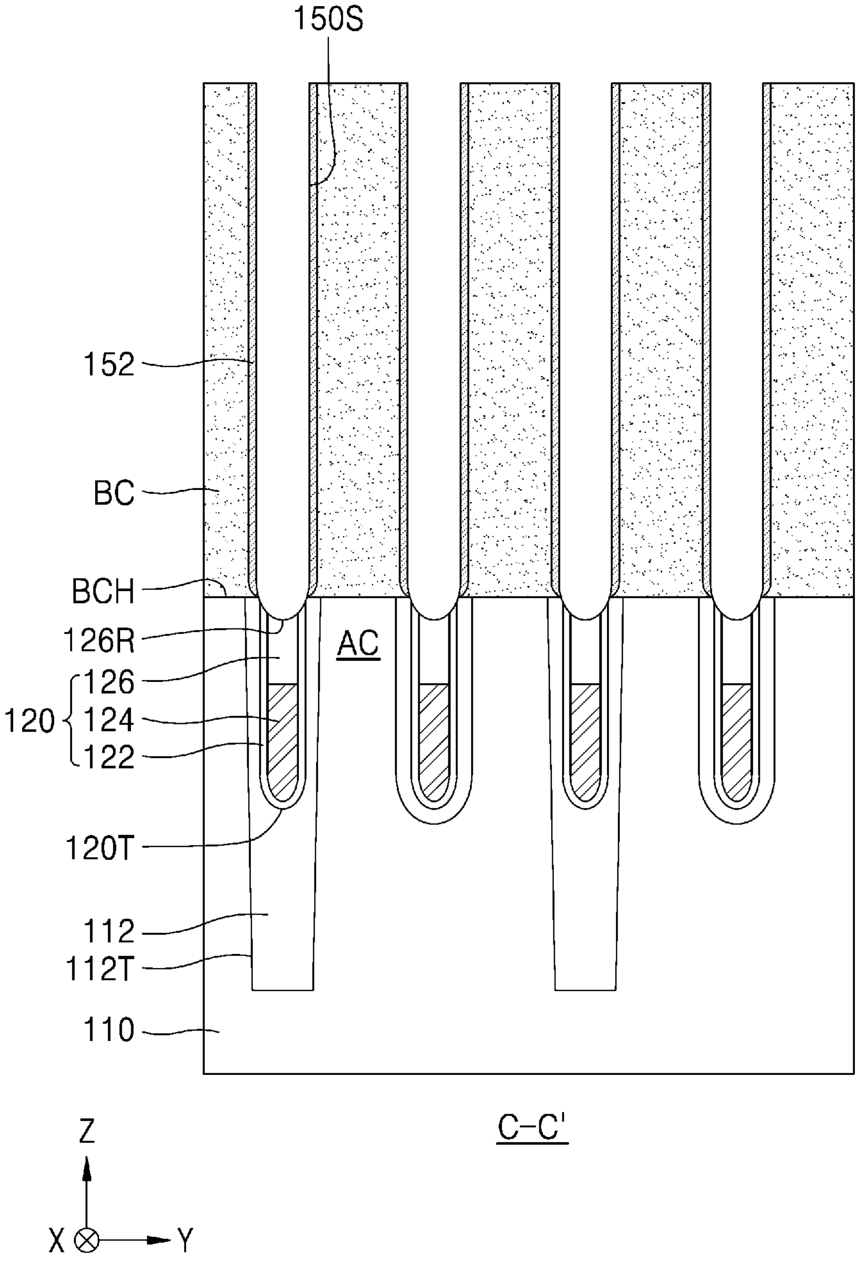

Referring to FIGS. 12A, 12B and 12C, a selective oxidation process or a selective nitridation process may be performed on the exposed sidewalls of the plurality of buried contacts BC.

The vertical insulating layers 152 may be provided on the exposed sidewalls of the plurality of buried contacts BC by the selective oxidation process or the selective nitridation process, and the etch residues RD in FIG. 11 may be converted into the residual insulating layers 154 by the selective oxidation process or the selective nitridation process.

In one or more example embodiments, the vertical insulating layers 152 may be provided by converting silicon atoms in a portion of the sidewalls of the plurality of buried contacts BC to silicon oxide through an oxidation process or to silicon nitride through a nitridation process. The vertical insulating layers 152 may be provided on the exposed surfaces of the entire second sidewalls of the plurality of buried contacts BC that are spaced apart from each other in the second horizontal direction Y. Because the first sidewalls of the plurality of buried contacts BC provided apart from each other in the first horizontal direction X may not be exposed to an oxidizing or nitridation atmosphere by contacting the third spacer layer 146, the vertical insulating layers 152 may not be provided on the first sidewalls.

In one or more example embodiments, silicon atoms in the etch residues RD in FIG. 11B may be converted into silicon oxide through an oxidation process or converted into silicon nitride through a nitridation process to provide the residual insulating layers 154. Accordingly, the residual insulating layers 154 may be provided below the third spacer layer 146 and in the plurality of recesses 126R, and may be connected to the two adjacent buried contacts BC in the second horizontal direction Y. For example, one end of the residual insulating layers 154 may be connected to the one buried contact BC from among the two adjacent buried contacts BC, and the other end of the residual insulating layers 154 may be connected to the other buried contact BC among the two adjacent buried contacts BC.

As the etch residues RD in FIG. 11B are converted into the residual insulating layers 154 according to one or more example embodiments, unwanted short circuits or bridges between the two adjacent buried contacts BC may be effectively reduced or even prevented.

Figure 13A:
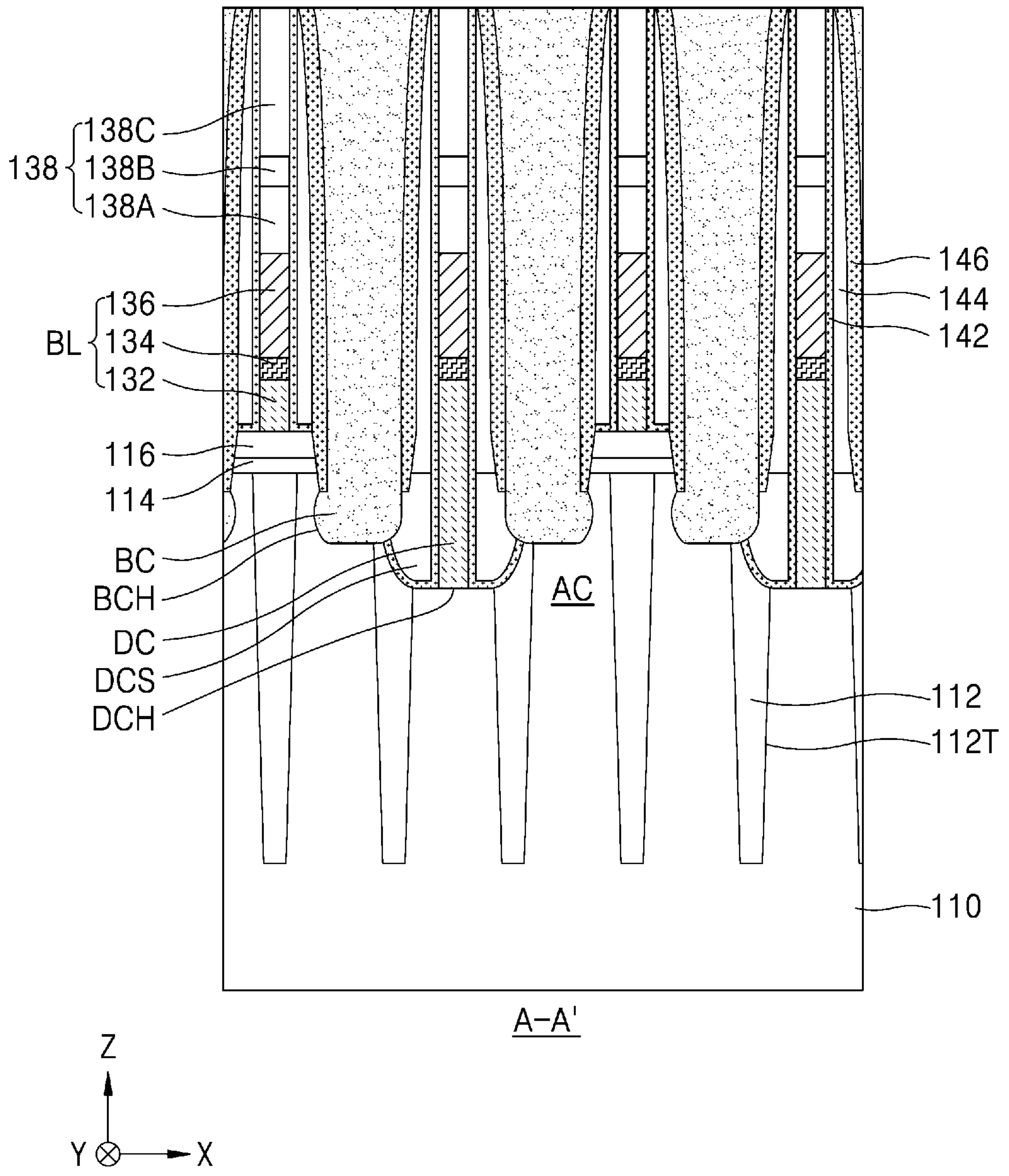
Figure 13B:
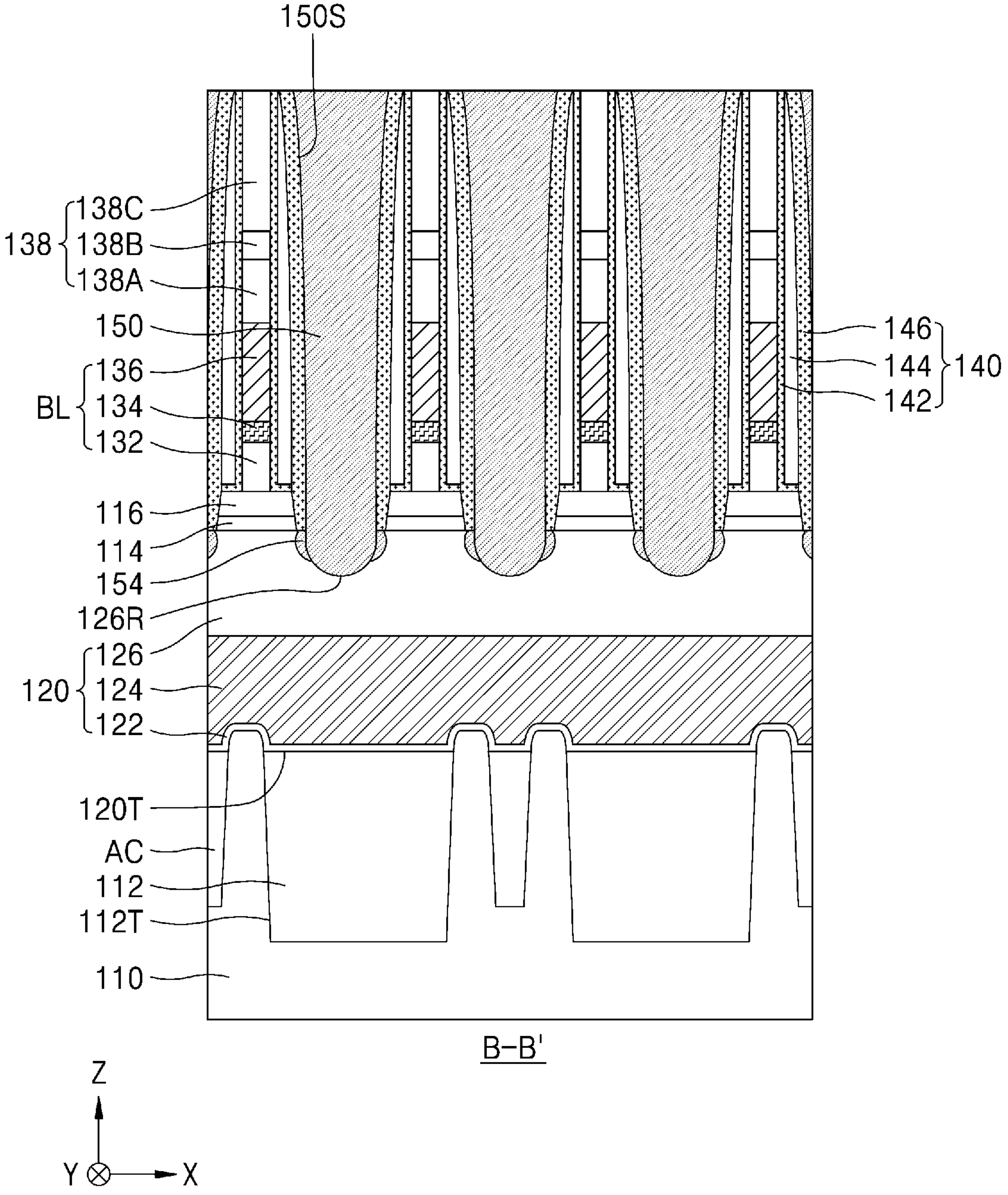
Figure 13C:
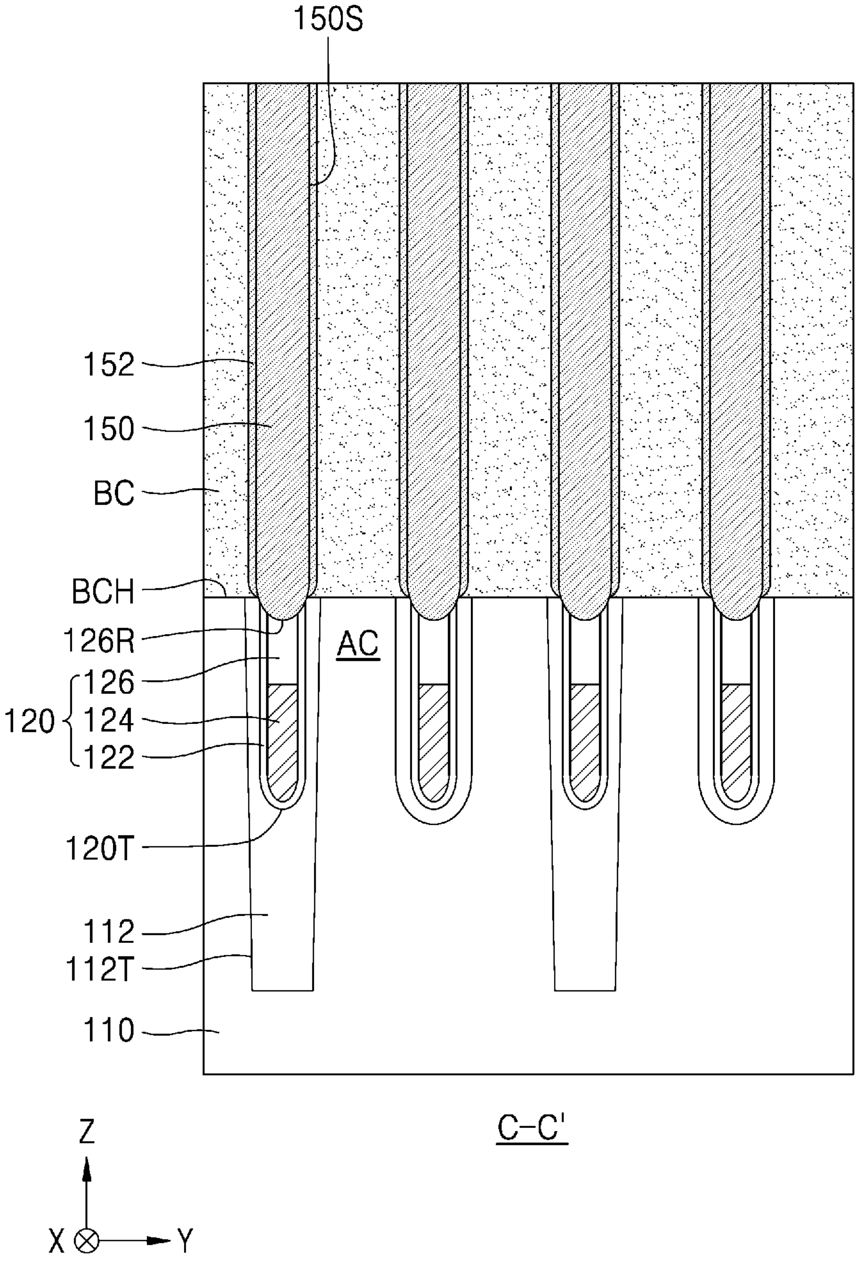

Referring to one or more example embodiments shown in FIGS. 13A, 13B and 13C, the plurality of insulating fences 150 are provided in the space (e.g., the insulating fence spaces 150S) between the plurality of bitlines BL and between the plurality of buried contacts BC.

In one or more example embodiments, the plurality of insulating fences 150 may include, but are not limited to, silicon nitride. The plurality of insulating fences 150 may have top surfaces positioned at the same level as top surfaces of the plurality of buried contacts BC.

Figure 14A:
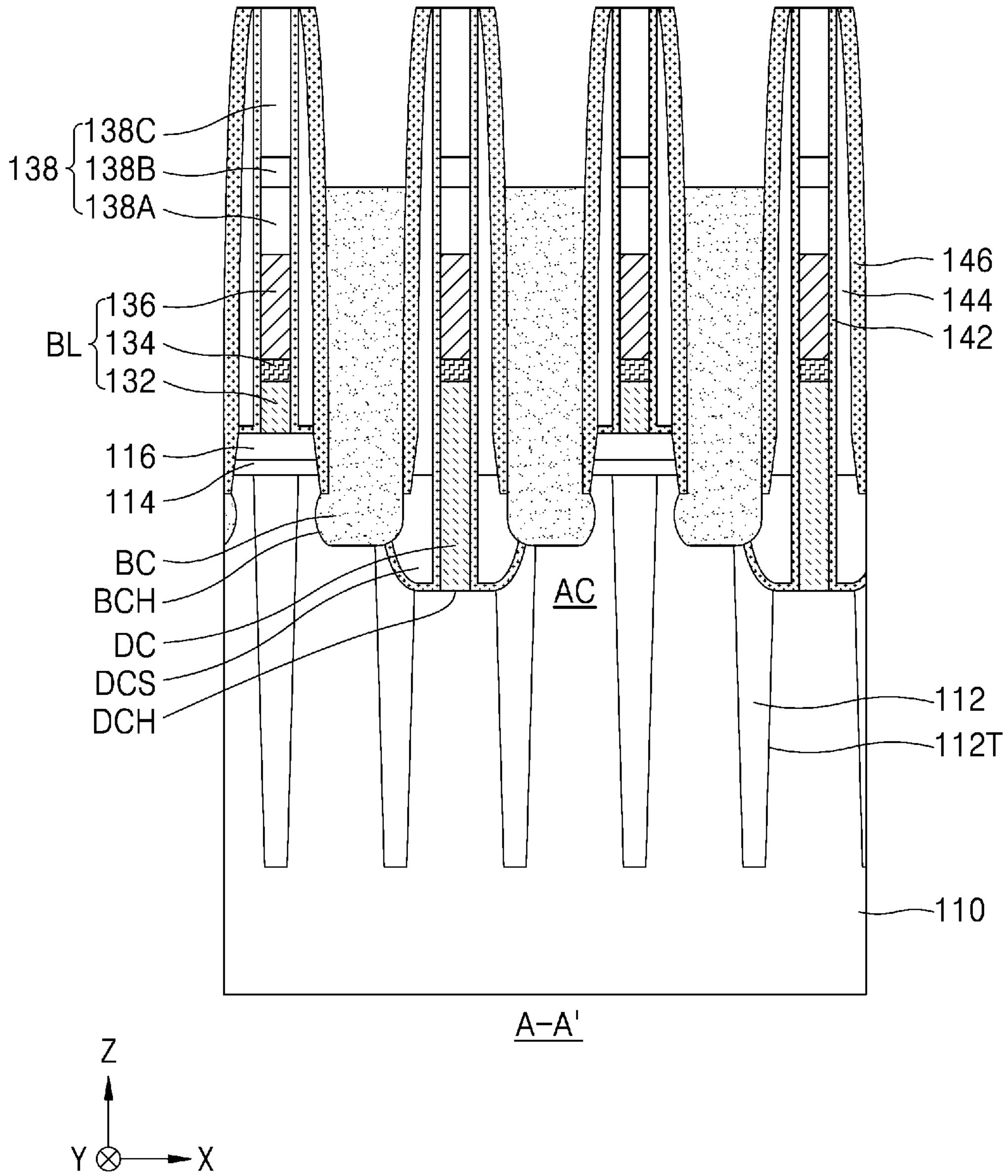
Figure 14B:
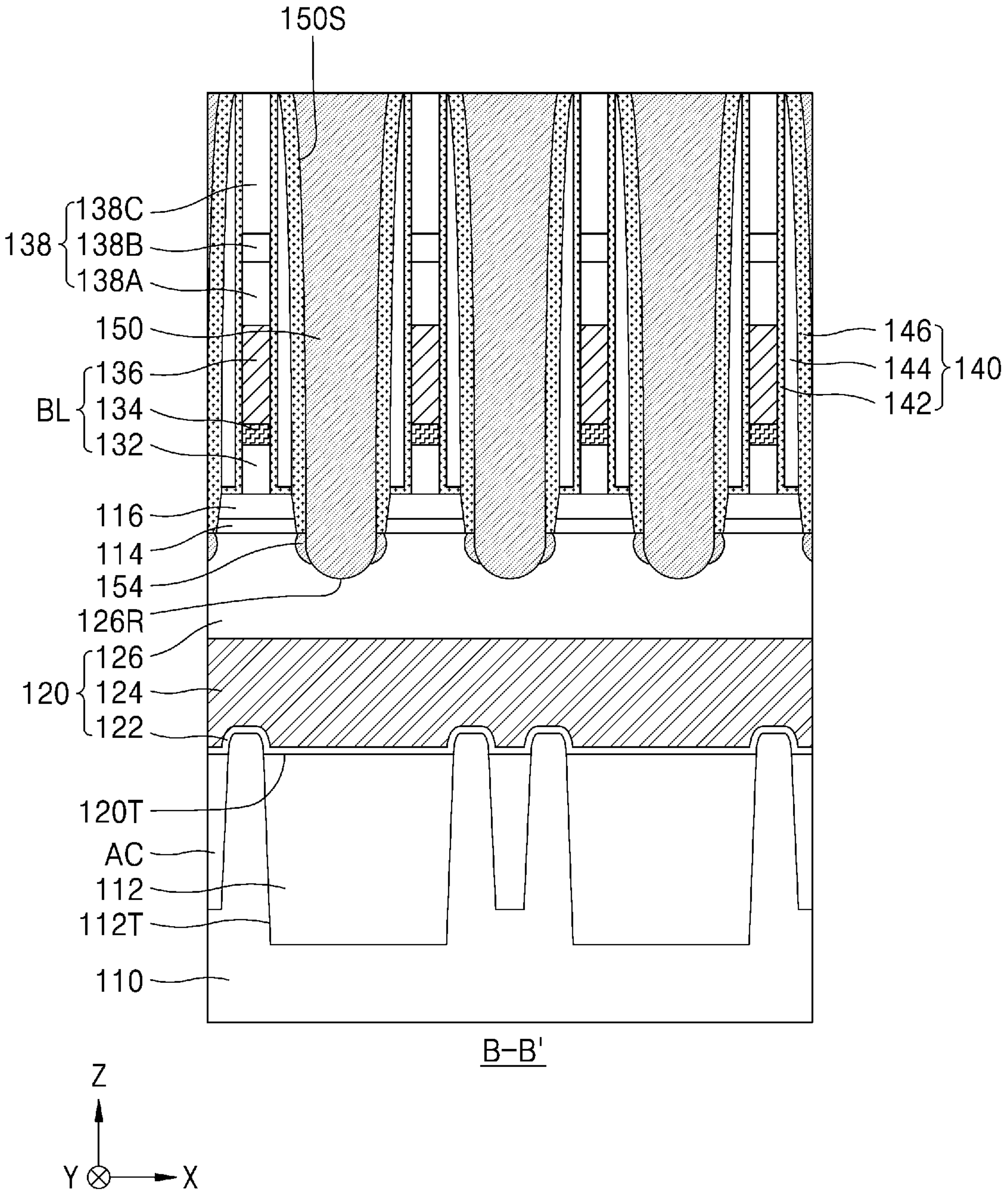
Figure 14C:
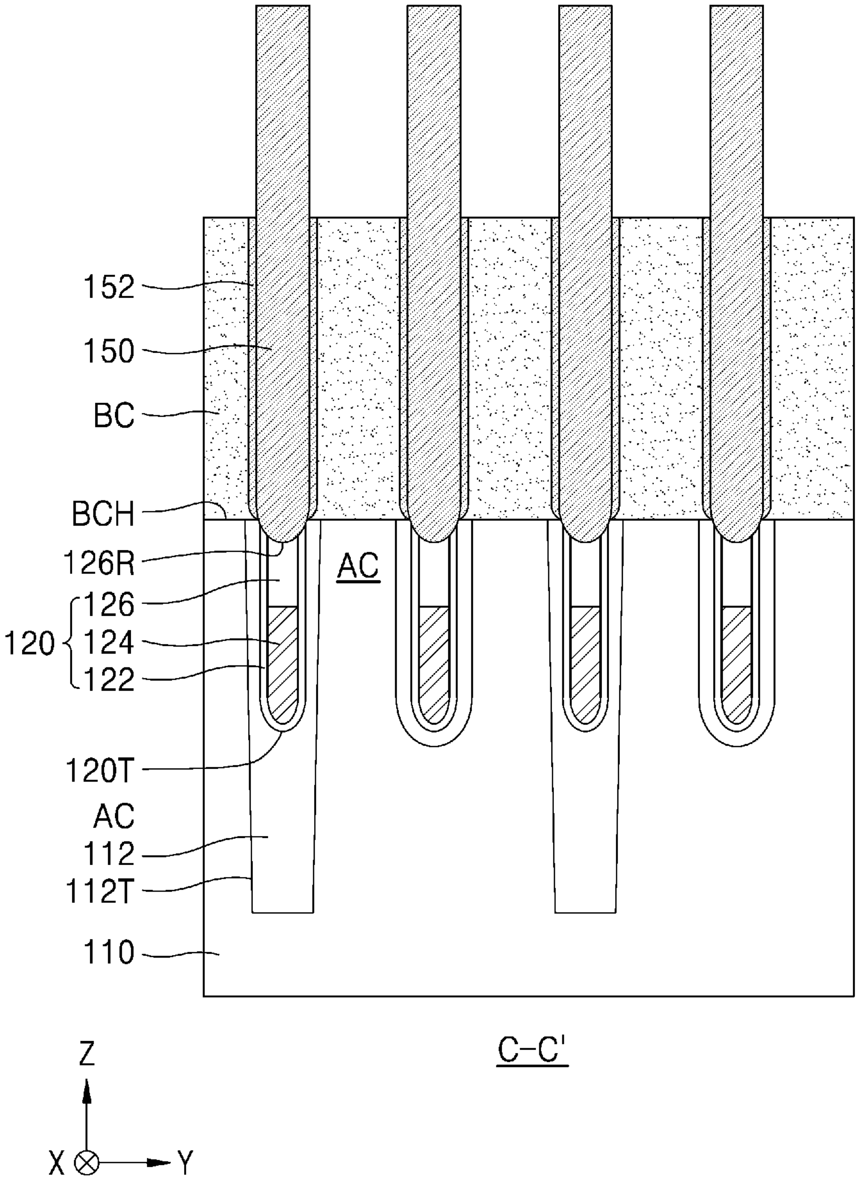

Referring to FIGS. 14A, 14B and 14C, an etching process may be performed on the upper side of the plurality of buried contacts BC to lower the height of the plurality of buried contacts BC.

The plurality of buried contacts BC may have top surfaces positioned at a lower level than top surfaces of the plurality of insulating fences 150. In addition, a part of the sidewall of the third spacer layer 146 may be exposed through an etching process.

In one or more example embodiments, a portion of the vertical insulating layers 152 provided on sidewalls of the plurality of insulating fences 150 may be removed in the etching process. Accordingly, the vertical insulating layers 152 may have a top surface positioned at the same level as the top surface of the plurality of buried contacts BC.

Figure 15A:
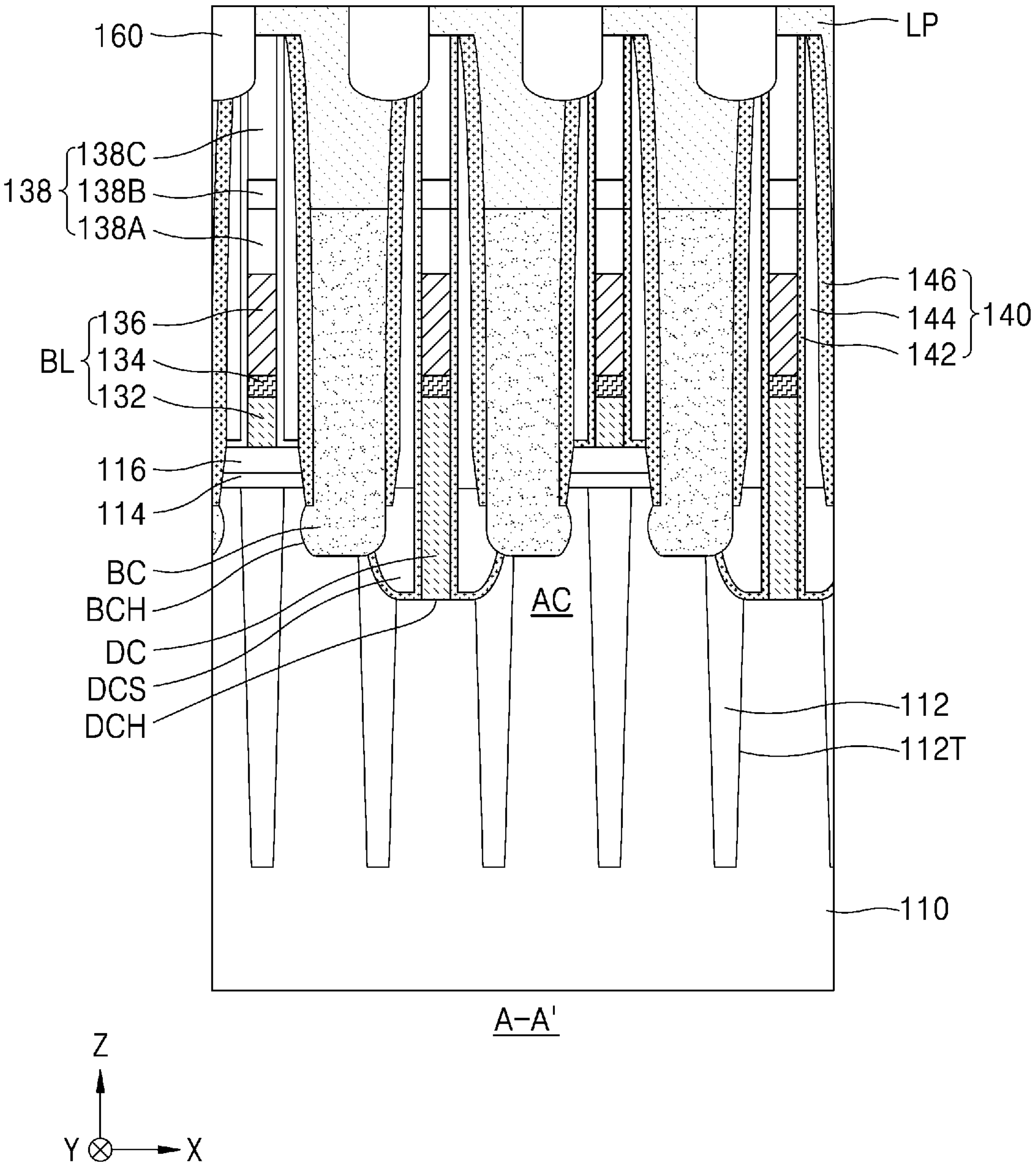
Figure 15B:
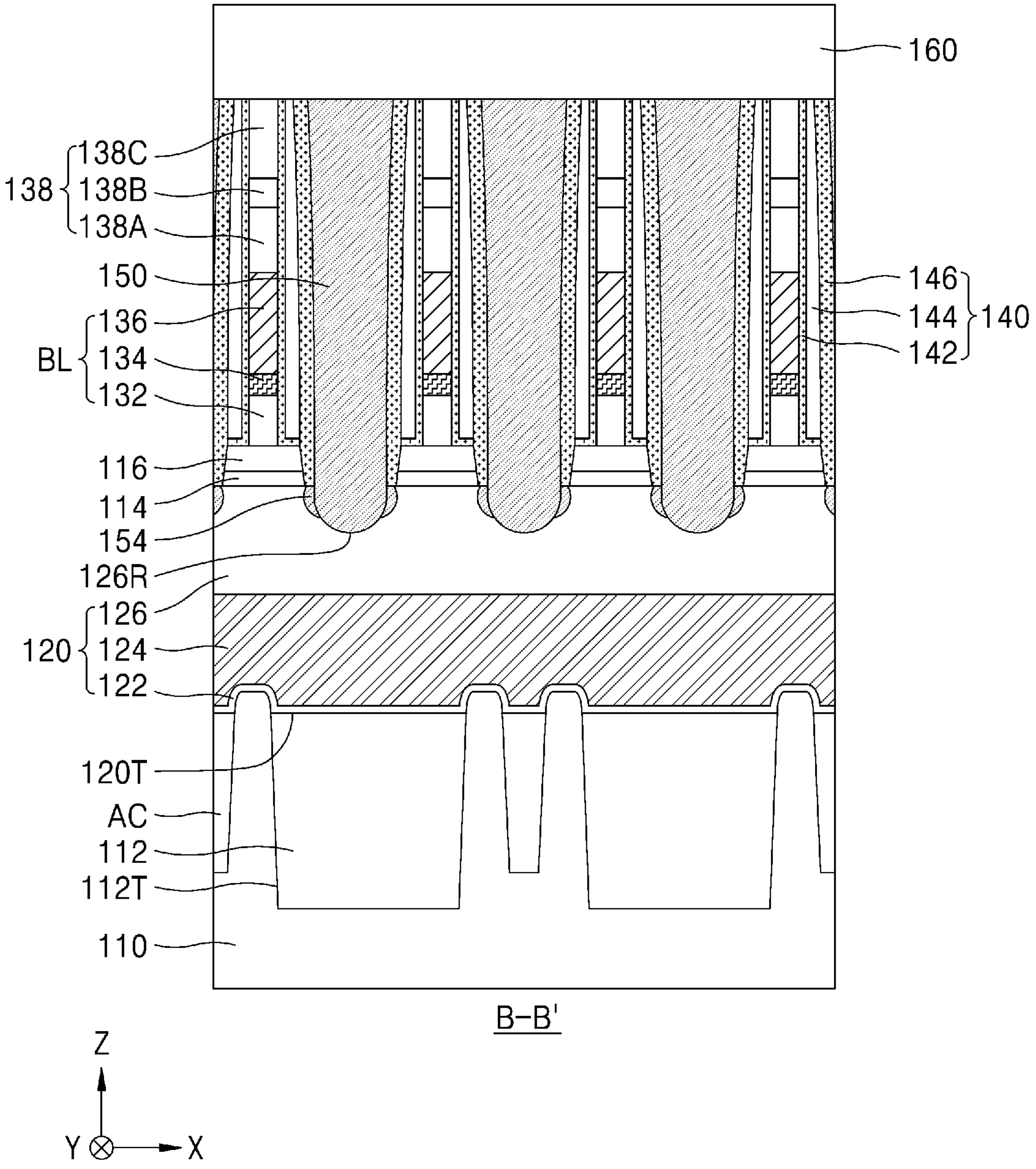
Figure 15C:
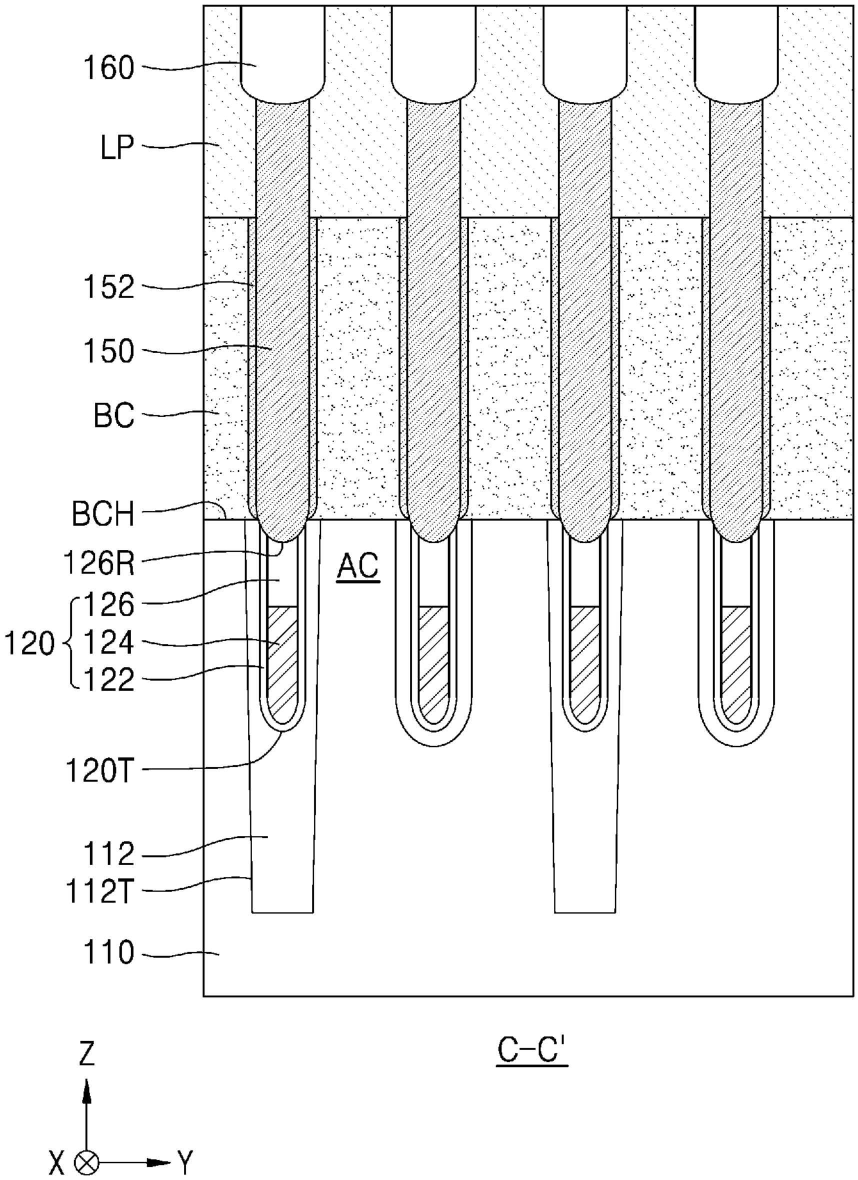

Referring to FIGS. 15A, 15B and 15C, the plurality of landing pads LP may be provided by forming a conductive layer on top surfaces of the plurality of buried contacts BC and by removing a portion of the conductive layer.

Bottom portions of the plurality of landing pads LP may be positioned between the plurality of insulating fences 150 and between the plurality of bitlines BL. In addition, the insulating patterns 160 may be provided to cover the plurality of landing pads LP.

Referring back to one or more example embodiments shown in FIG. 2, the lower electrodes 182 connected to the landing pads LP may be provided, and the capacitor dielectric layer 184 and the upper electrode 186 may be sequentially provided on sidewalls of the lower electrodes 182. The integrated circuit device 10 according to one or more example embodiments may be produced by performing such methods.

According to the method of manufacturing the integrated circuit device of one or more example embodiments, a portion of the substrate 110 exposed to the space between the plurality of bitlines BL may be removed to provide the line-type or trench-type buried contact holes BCH, provide the preliminary contact layer PBC filling the space between the plurality of bitlines BL, and provide the plurality of buried contacts BC by patterning the same. In addition, the vertical insulating layers 152 may be provided by performing a selective oxidation or selective nitridation process on the exposed side surfaces of the plurality of buried contacts BC, and the insulating fences 150 filling the space between the plurality of buried contacts BC may be provided. Therefore, polysilicon residues remaining in the process of removing the preliminary contact layer PBC may be oxidized by the selective oxidation process or nitrided by the selective nitridation process, thereby reducing or preventing defects of bridges between buried contacts BC.

Figure 16:
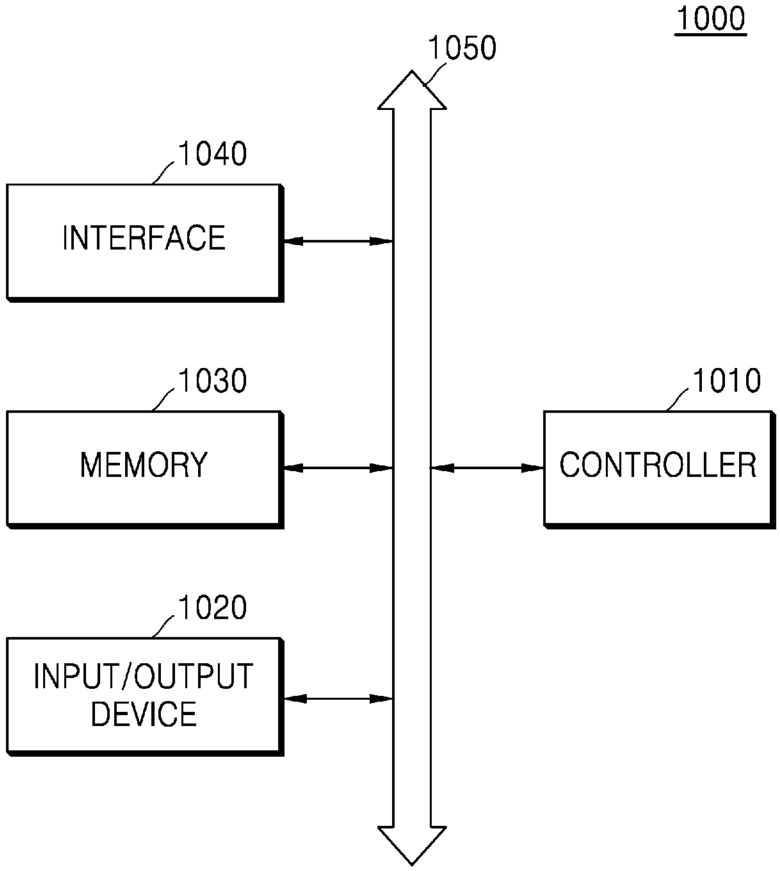
FIG. 16 is a configuration diagram of a system including an integrated circuit device according to one or more example embodiments.

FIG. 16 is a configuration diagram of a system including an integrated circuit device according to one or more example embodiments.

Referring to FIG. 16, a system 1000 may include a controller 1010, an input/output device 1020, a memory 1030, an interface 1040, and a bus 1050.

The system 1000 may be a mobile system or a system that transmits and/or receives information. In one or more example embodiments, the mobile system may be a portable computer, a web tablet, a mobile phone, a digital music player, or a memory card, but one or more example embodiments are not limited thereto.

The controller 1010 may be configured to control an execution program in the system 1000, and may include, but is not limited to, a microprocessor, a digital signal processor, a microcontroller, or a device similar thereto.

The input/output device 1020 may be used to input or output data to or from the system 1000. The system 1000 may be connected to an external device, e.g., a personal computer or a network, and may exchange data with the external device using the input/output device 1020. The input/output device 1020 may be, for example, a touch screen, a touch pad, a keyboard, or a display device, but one or more example embodiments are not limited thereto.

The memory 1030 may store data for operation of the controller 1010, or may store data processed by the controller 1010. The memory 1030 may include the integrated circuit device 10 according to one or more example embodiments described above.

The interface 1040 may be a data transmission path between the system 1000 and the external device. The controller 1010, the input/output device 1020, the memory 1030, and the interface 1040 may communicate with each other via the bus 1050.

While one or more example embodiments have been particularly shown and described above, it will be apparent that various changes in form and details may be made therein without departing from the spirit and scope of the following claims.

What is claimed is:

1. An integrated circuit device comprising:

a substrate comprising a plurality of active regions;

a plurality of device isolation layers provided in the substrate and defining the plurality of active regions;

a plurality of bitlines spaced apart from each other in a first horizontal direction on the substrate and extending in a second horizontal direction crossing the first horizontal direction;

a plurality of insulating fences spaced apart from each other in the second horizontal direction and provided between, and spaced apart from, adjacent bitlines of the plurality of bitlines;

a plurality of buried contacts connected to the plurality of active regions and provided between adjacent bitlines of the plurality of bitlines and between the plurality of insulating fences; and a plurality of vertical insulating layers vertically positioned between the plurality of insulating fences and the plurality of buried contacts.

2. The integrated circuit device of claim 1, further comprising:

a wordline extending in the first horizontal direction within the substrate;

a wordline capping layer covering an upper surface of the wordline;

a plurality of recesses provided in the wordline capping layer and in which lower portions of the plurality of insulating fences are provided; and a plurality of residual insulating layers provided on sidewalls of a lower portion of the plurality of insulating fences in at least one of the plurality of recesses, wherein the plurality of residual insulating layers and the plurality of vertical insulating layers comprise substantially a same material.

3. The integrated circuit device of claim 2, wherein the plurality of insulating fences comprise silicon nitride, and wherein each of the plurality of vertical insulating layers and each of the plurality of residual insulating layers comprise silicon oxide or silicon nitride.

4. The integrated circuit device of claim 3, wherein the plurality of buried contacts comprise polysilicon, and wherein each of the plurality of vertical insulating layers and each of the plurality of residual insulating layers are provided by an oxidation process or a nitridation process for polysilicon.

5. The integrated circuit device of claim 4, wherein the vertical insulating layers are provided on sidewalls of the plurality of buried contacts by the oxidation process or the nitridation process, and wherein the plurality of residual insulating layers are provided on sidewalls of the lower portion of the plurality of insulating fences by the oxidation process or the nitridation process.

6. The integrated circuit device of claim 2, further comprising spacers provided on both sidewalls of each of the plurality of bitlines, wherein the plurality of residual insulating layers are provided under the spacers.

7. The integrated circuit device of claim 2, wherein each of the plurality of buried contacts comprises:

first sidewalls spaced apart from each other in the first horizontal direction; and second sidewalls spaced apart from each other in the second horizontal direction, and wherein the plurality of vertical insulating layers are provided on the second sidewalls.

8. The integrated circuit device of claim 7, wherein the plurality of vertical insulating layers are not provided on the first sidewalls.

9. The integrated circuit device of claim 2, wherein an uppermost surface of each of the plurality of insulating fences is provided at a level higher than an uppermost surface of each of the plurality of buried contacts, and wherein an uppermost surface of each of the plurality of vertical insulating layers is provided at a same level as the uppermost surface of each of the plurality of buried contacts.

10. The integrated circuit device of claim 9, wherein a lowermost surface of each of the plurality of residual insulating layers is provided at a level higher than a lowermost surface of each of the plurality of insulating fences.

11. An integrated circuit device comprising:

a substrate comprising a plurality of active regions;

a plurality of device isolation layers provided in the substrate and defining the plurality of active regions;

a plurality of bitlines spaced apart from each other in a first horizontal direction on the substrate and extending in a second horizontal direction crossing the first horizontal direction, wherein spacers are provided on both sidewalls of each of the plurality of bitlines;

a plurality of insulating fences spaced apart from each other in the second horizontal direction and provided between, and spaced apart from, adjacent bitlines of the plurality of bitlines, wherein the plurality of insulating fences contact the spacers;

a plurality of buried contacts connected to the plurality of active regions and provided between adjacent bitlines of the plurality of bitlines and between the plurality of insulating fences;

a plurality of vertical insulating layers vertically positioned between the plurality of insulating fences and the plurality of buried contacts; and a plurality of residual insulating layers provided on sidewalls of at least one of the plurality of insulating fences below the spacers, wherein the plurality of vertical insulating layers and the plurality of residual insulating layers comprise substantially a same material.

12. The integrated circuit device of claim 11, wherein the plurality of vertical insulating layers and the plurality of residual insulating layers form an integral structure with the plurality of insulating fences.

13. The integrated circuit device of claim 12, wherein the integral structure comprises at least one of silicon oxide or silicon nitride.

14. The integrated circuit device of claim 11, wherein in plan view:

each of the plurality of residual insulating layers is provided between two adjacent buried contacts of the plurality of buried contacts, one end of each of the plurality of residual insulating layers is connected to one of two adjacent buried contacts of the plurality of buried contacts, and another end of each of the plurality of residual insulating layers is connected to another one of the two adjacent buried contacts of the plurality of buried contacts.

15. The integrated circuit device of claim 14, wherein the plurality of residual insulating layers are provided by an oxidation process or a nitridation process on etch residues of the plurality of buried contacts.

16. An integrated circuit device comprising:

a substrate comprising a plurality of active regions;

a plurality of device isolation layers provided in the substrate and defining the plurality of active regions;

a plurality of bitlines spaced apart from each other in a first horizontal direction on the substrate and extending in a second horizontal direction crossing the first horizontal direction, wherein spacers are provided on both sidewalls of each of the plurality of bitlines;

a plurality of wordlines extending in the first horizontal direction;

a plurality of wordline capping layers covering upper surfaces of the wordlines;

a plurality of insulating fences spaced apart from each other in the second horizontal direction and provided between, and spaced apart from, adjacent bitlines of the plurality of bitlines, wherein the plurality of insulating fences contact the spacers;

a plurality of buried contacts connected to the plurality of active regions and provided between adjacent bitlines of the plurality of bitlines and between the plurality of insulating fences;

a plurality of vertical insulating layers vertically positioned between the plurality of insulating fences and the plurality of buried contacts;

a plurality of residual insulating layers provided on sidewalls of at least one of the plurality of insulating fences below the spacers;

a plurality of landing pads provided on the plurality of buried contacts; and a plurality of capacitor structures electrically connected to the plurality of landing pads.

17. The integrated circuit device of claim 16, wherein each of the plurality of buried contacts comprises:

first sidewalls spaced apart from each other in the first horizontal direction; and second sidewalls spaced apart from each other in the second horizontal direction, wherein the plurality of vertical insulating layers are not provided on the first sidewalls, and wherein the plurality of vertical insulating layers are provided on the second sidewalls.

18. The integrated circuit device of claim 16, wherein an uppermost surface of each of the plurality of insulating fences is provided at a level higher than an uppermost surface of each of the plurality of buried contacts, and wherein an uppermost surface of each of the plurality of vertical insulating layers is provided at a same level as the uppermost surface of each of the plurality of buried contacts.

19. The integrated circuit device of claim 18, wherein an uppermost surface of each of the plurality of residual insulating layers is provided at a level lower than a lowermost surface of each of the plurality of bitlines, and wherein a lowermost surface of each of the plurality of residual insulating layers is provided at a level higher than a lowermost surface of each of the plurality of insulating fences.

20. The integrated circuit device of claim 16, wherein each of the plurality of vertical insulating layers and each of the plurality of residual insulating layers comprise silicon oxide or silicon nitride, and wherein the plurality of residual insulating layers are provided by an oxidation process or a nitridation process on etch residues of the plurality of buried contacts.

* * * * *